United States Patent
Romero

(10) Patent No.: US 9,753,097 B2
(45) Date of Patent: Sep. 5, 2017

(54) MAGNETIC FIELD SENSORS AND ASSOCIATED METHODS WITH REDUCED OFFSET AND IMPROVED ACCURACY

(71) Applicant: Allegro Microsystems, LLC, Worcester, MA (US)

(72) Inventor: Hernan D. Romero, Buenos Aires (AR)

(73) Assignee: Allegro Microsystems, LLC, Worcester, MA (US)

( * ) Notice: Subject to any disclaimer, the term of this patent is extended or adjusted under 35 U.S.C. 154(b) by 625 days.

(21) Appl. No.: 14/269,973

(22) Filed: May 5, 2014

(65) Prior Publication Data

US 2015/0316623 A1 Nov. 5, 2015

(51) Int. Cl.
*G01R 33/07* (2006.01)
*G01R 33/00* (2006.01)

(52) U.S. Cl.
CPC ....... *G01R 33/0029* (2013.01); *G01R 33/077* (2013.01)

(58) Field of Classification Search
CPC .......................... G01R 33/0029; G01R 33/077
See application file for complete search history.

(56) References Cited

U.S. PATENT DOCUMENTS 4,668,914 A 5/1987 Kersten et al.
4,761,569 A 8/1988 Higgs
(Continued)

FOREIGN PATENT DOCUMENTS

DE 10 2005 014 509 B4 10/2006
DE 10 2006 037 226 A1 2/2008
(Continued)

OTHER PUBLICATIONS

PCT International Preliminary Report on Patenability and Written Opinion of the ISA; dated Nov. 17, 2016; for PCT Pat Appl. No. PCT/US2015/027428; 11 pages.
(Continued)

*Primary Examiner* — Huy Q Phan
*Assistant Examiner* — Adam Clarke
(74) *Attorney, Agent, or Firm* — Daly, Crowley, Mofford & Durkee, LLP

(57) ABSTRACT

A magnetic field sensor with a plurality of magnetic field sensing elements is provided herein. The magnetic field sensor includes a circular vertical Hall (CVH) sensing element comprising a plurality of vertical Hall elements arranged over a common implant and diffusion region in a substrate, wherein the plurality of vertical Hall elements is configured to generate a plurality of magnetic field signals, each magnetic field signal responsive to a magnetic field. The magnetic field sensor further includes a sequence switches circuit coupled to the plurality of vertical Hall elements, wherein the sequences switches circuit is operable to select from among the plurality of vertical Hall elements, wherein each selected one of the one or more of the plurality of vertical Hall elements comprises a respective plurality of active vertical Hall element contacts and at least one respective skipped contact, the at least one skipped contact disposed between at least one respective pair of active vertical Hall element contacts, wherein a position of the at least one skipped contact is selected to reduce an offset voltage of a respective one of the plurality of vertical Hall elements. An associated method is also disclosed herein.

24 Claims, 12 Drawing Sheets

(56) References Cited

U.S. PATENT DOCUMENTS

| | | | |
|---|---|---|---|
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |
| 6,236,199 B1 | 5/2001 | Irle et al. |
| 6,265,864 B1 | 7/2001 | De Winter et al. |
| 6,288,533 B1 | 9/2001 | Haeberli et al. |
| 6,297,627 B1 | 10/2001 | Towne et al. |
| 6,356,741 B1 | 3/2002 | Bilotti et al. |
| 6,525,531 B2 | 2/2003 | Forrest et al. |
| 6,542,068 B1 | 4/2003 | Drapp et al. |
| 6,545,462 B2 | 4/2003 | Schott et al. |
| 6,622,012 B2 | 9/2003 | Bilotti et al. |
| 6,768,301 B1 | 7/2004 | Hohe et al. |
| 6,969,988 B2 | 11/2005 | Kakuta et al. |
| 7,030,606 B2 | 4/2006 | Kato et al. |
| 7,038,448 B2 | 5/2006 | Schott et al. |
| 7,085,119 B2 | 8/2006 | Bilotti et al. |
| 7,119,538 B2 | 10/2006 | Blossfeld |
| 7,159,556 B2 | 1/2007 | Yoshihara |
| 7,235,968 B2 | 6/2007 | Popovic et al. |
| 7,259,556 B2 | 8/2007 | Popovic et al. |
| 7,307,824 B2 | 12/2007 | Bilotti et al. |
| 7,362,094 B2 | 4/2008 | Voisine et al. |
| 7,714,570 B2 | 5/2010 | Thomas et al. |
| 7,746,065 B2 | 6/2010 | Pastre et al. |
| 7,759,929 B2 | 7/2010 | Forsyth |
| 7,872,322 B2 | 1/2011 | Schott et al. |
| 7,911,203 B2 | 3/2011 | Thomas et al. |
| 7,965,076 B2 | 6/2011 | Schott |
| 7,994,774 B2 | 8/2011 | Thomas et al. |
| 2006/0011999 A1 | 1/2006 | Schott et al. |
| 2006/0028204 A1* | 2/2006 | Oohira .................. G01R 33/077 324/207.25 |
| 2007/0029998 A1 | 2/2007 | Popovic et al. |
| 2008/0094055 A1* | 4/2008 | Monreal .................. G01D 3/02 324/117 H |
| 2009/0121707 A1 | 5/2009 | Schott |
| 2009/0174395 A1 | 7/2009 | Thomas et al. |
| 2010/0133632 A1* | 6/2010 | Schott .................... G01R 33/07 257/427 |
| 2010/0156397 A1 | 6/2010 | Yabusaki et al. |
| 2010/0164491 A1 | 7/2010 | Kejik et al. |
| 2010/0219821 A1* | 9/2010 | Rocznik .................. G01R 33/07 324/251 |
| 2011/0248708 A1 | 10/2011 | Thomas et al. |
| 2012/0217959 A1* | 8/2012 | Kitade .................. G01R 33/072 324/244 |
| 2012/0313635 A1 | 12/2012 | Daubert |
| 2013/0015874 A1* | 1/2013 | Yang .................... H05K 7/1444 324/756.02 |
| 2013/0307609 A1 | 11/2013 | Ausserlechner |
| 2014/0070795 A1* | 3/2014 | Kolb ...................... G01R 33/07 324/202 |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

PCT Search Report and Written Opinion of the ISA dated Aug. 3, 3015; for PCT Pat. App. No. PCT/US2015/027428; 13 pages.

E. Schuring, C. Schott, P.-A. Besse, R.S. Popovic, CMOS Integrated Vertical Hall Sensor with Low Offset, XVI The $16^{th}$ European Conference on Solid-State Transducers, Prague, Czech Republic, Sep. 15-18, 2002, pp. 868-871.

P. Kejik, S. Reymond, R.S. Popovic, Circular Hall Transducer for Angular Postion Sensing, IEEE, Jun. 10-14, 2007, pp. 2593-2596.

S. Reymond, P. KejiK, R.S. Popovic, True 5D CMOS integrated Hall sensor, Swiss Federal Institute of Technology, 4 pages.

Mirjana Banjevic, High Bandwith CMOS Magnetic Sensors Based on the Miniature Circular Vertical Hall Device, Ecole Polytechnique Federale De Lausanne, 2011, pp. 1-153.

R.S. Popovic, The Vertical Hall-Effect Device, IEEE Electron Device Letters, vol. EDL-5, No. 9, Sep. 1984, pp. 357-358.

Petrie; "Circular Vertical Hall Magnetic Field Sensing Element and Method with a Plurality of Continuous Output Signals;" U.S. Appl. No. 13/035,243, filed Feb. 25, 2011; 56 pages.

Melexis MLX 90324; ""Under-the-Hood" Triaxis Rotary Position feat. SENT Protocol;" 3901090324 Data Sheet; Dec. 2008; 40 pages.

Mirjana Banjevic, High Bandwith CMOS Magnetic Sensors Based on the Miniaturized Circular Vertical Hall Device, Sep. 9, 2011, pp. 1-153.

Allegro Microsystems, Inc.; "High Precision Linear Hall Effect Sensor IC with a Push/Pull, Pulse Width Modulated Output," A1351; pp 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwith (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik, et al.; "Ultra Low-Power Angular Postion Sensor for High-Speed Portable Applications;" 2009 IEEE Sensors Conference; Oct. 25-28, 2009; pp. 173-176.

Reymond, et al.; "True 2D CMOS Intregrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Inegrierte Schaltungen IIS; www.iis.fraunhofer.de/asic/analog; Oct. 2009; 2 pages.

Melexis Microelectronic Integrated Systems; MLX90333; "Triaxis 3D-Joystick Postion Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

(56) References Cited

OTHER PUBLICATIONS

MEMSIC Corporation; AN-00MM-002; "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Placement Guildlines;" Oct. 2008; 2 pages.
MEMSIC Corporation; MMC312xMQ; "Tri-axis Magnetic Sensor, with I²C Interface;" Aug. 14, 2008; 9 pages.
MEMSIC Corporation; MMC314xMS; "Ultra Small 3-axis Magnetic Sensor, with I²C Interface;" Mar. 31, 2010; 8 pages.
Micronas GmbH; "HAL® 3625 Programmable Direct Angle Sensor;" Product Information; Sep. 2009; 2 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch with Internally or Externally Controlled Sample and Sleep Periods for Track Ball and Scroll Applications;" published Jul. 25, 2009; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2006; pp. 1-23.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall Effect IC Applications Guide;" Application Information, Rev. 2; http://www.allegromicro.com/en/products/design/hall-effect-sensor-ic-applications-guide/AN27701.pdf: downloaded Sep. 29, 2009; pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designers's Perspective;" IEEE Electro International Apr. 26-28, 1991; pp. 129-134.
Austria Microsystems; "AS5040 datasheet; 10-Bit Programmable Magnetic Rotary Encoder," Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device" International Electron Devices Meeting; Dec. 8-11, 1996; pp. 541-544.
Burger et al.; "New fully integrated 3-D silicon Hall sensor for precise for precise angular-postion measurements;" Sensors and Actuators, A 67; May 1998; pp. 72-76.
Dwyer; "Allegro Microsystems, Inc.; AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Journal of Applied Physics, vol. 85, No. 8; Apr. 15, 1999; pp. 5459-5461.
Gilbert; "Technical Advances in Hall-Effect Sensing;" Allegro Microsystems, Inc. Product Description: May 10, 2008; 7 sheets.

Häberll et al.; "Contacless Angle Measurements by CMOS Magnetic Sensor with On Chip Read-Out Circut;" The $8^{th}$ International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996: pp. 1902-1907.
Hiligsmann et al.; "Monolthic 360 Degrees Rotary Postion Sensor IC;" 2004 IEEE Proceedings of Sensors, vol. 3; Oct. 24-27, 2004; pp. 1137-1142.
Kejik et al.; "Circular Hall Transducer for Angular Postion Sensing;" International Solid-State Sensors, Actuators and Microsystems Conference; Transducers; Jun. 2007; pp. 2593-2596.
Lou Law; "Angle Postion Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceesings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall Magnetic-field sensor using active carrier confinement and post-proccess micromachining;" The $8^{th}$ International Conference on Solid-State Sensors and Actuators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic, "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement Systems;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101: "Angular position sensing with 2-Axis Hall IC 2SA-10;" Feb. 12, 2004; http://www.diegm.uniud.it/petrella/Azionamentl%20Elettricl%20ll/Sensorl%20e%20trasduttori/Data%20sheet%20-%202SA-10.pdf: pp. 1-7.
van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Drijaca, et al.; "Nonlinear Effects in Magnetic Angular Postion Sensor With Integrated Flux Concentrator," Proc. $23^{rd}$ International Conference on Microelectronics (MIEL 2002); vol. 1; NIS; Yugoslavia; May 12-15, 2002; pp. 223-226.
EPO Amendment dated Jun. 1, 2017 for EP Pat. Appl. No. 15721943.7; 4 pages.

(56) References Cited

OTHER PUBLICATIONS

Tracked Claims regarding EPO Amendment dated Jun. 1, 2017 for EP Pat. Appl. No. 15721943; 4 pages.

* cited by examiner

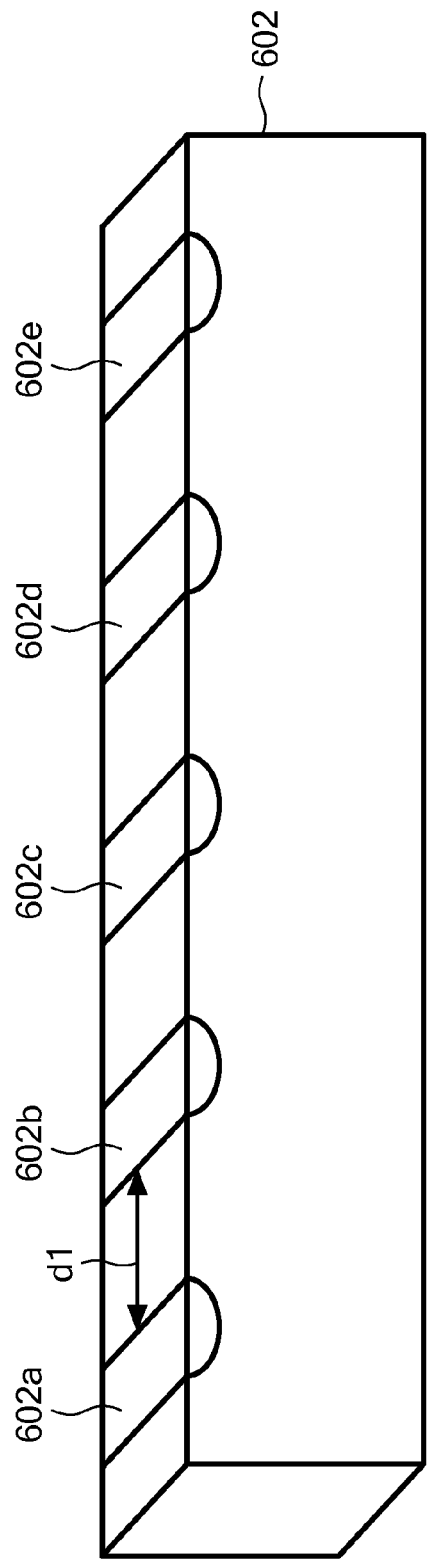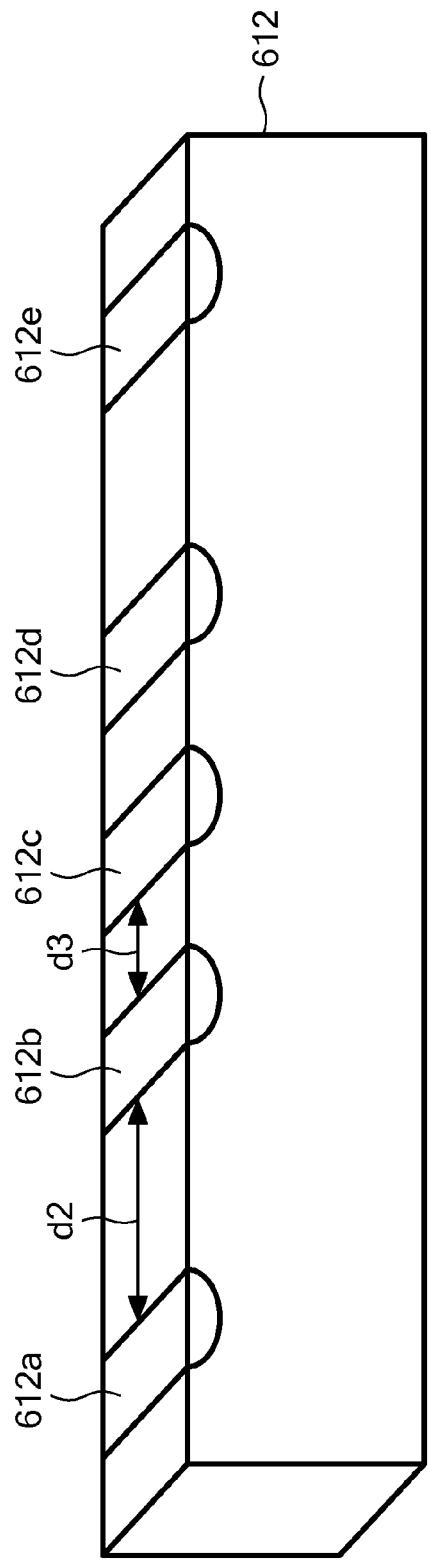

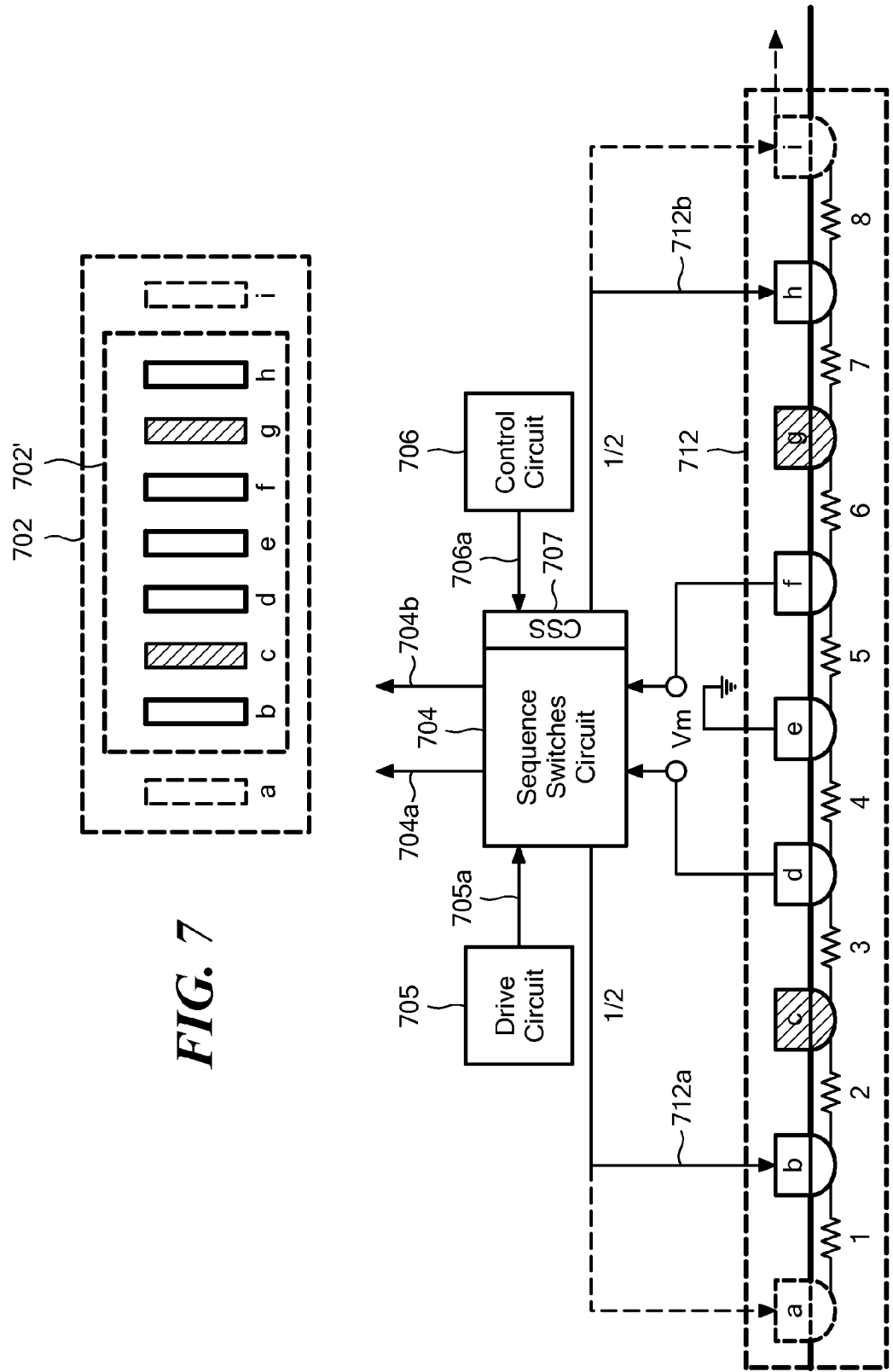

MAGNETIC FIELD SENSORS AND ASSOCIATED METHODS WITH REDUCED OFFSET AND IMPROVED ACCURACY

CROSS REFERENCE TO RELATED APPLICATIONS

Not Applicable.

STATEMENT REGARDING FEDERALLY SPONSORED RESEARCH

Not Applicable.

FIELD OF THE DISCLOSURE

This disclosure relates generally to magnetic field sensors, and, more particularly, to a magnetic field sensor having a plurality of vertical Hall elements that are combined in ways that reduce an offset component.

BACKGROUND OF THE DISCLOSURE

Magnetic field sensing elements can be used in a variety of applications. In one application, a magnetic field sensing element can be used to detect a direction of a magnetic field, i.e., and angle of the direction of the magnetic field. In another application, a magnetic field sensing element can be used to sense an electrical current. One type of current sensor uses a Hall Effect magnetic field sensing element in proximity to a current-carrying conductor.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element provides output signals from a plurality of vertical Hall elements from which it is constructed. Each vertical Hall element can have an undesirable and different DC offset.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements.

It would be desirable to provide magnetic field sensors and associated methods with reduced DC offsets generated by magnetic field sensing elements used therein (e.g., vertical Hall elements of a CVH sensing element). It would be further desirable to provide a magnetic field sensor with improved accuracy.

SUMMARY OF THE DISCLOSURE

The present disclosure provides magnetic field sensors and associated methods with reduced DC offsets generated by a plurality of magnetic field sensing elements used therein (e.g., vertical Hall elements of a CVH sensing element). The present disclosure also provides a magnetic field sensor with improved accuracy.

In one aspect, a magnetic field sensor includes a circular vertical Hall (CVH) sensing element comprising a plurality of vertical Hall elements arranged over a common implant and diffusion region in a substrate. The plurality of vertical Hall elements is configured to generate a plurality of magnetic field signals that are responsive to a magnetic field. Additionally, the magnetic field sensor includes a sequence switches circuit coupled to the plurality of vertical Hall elements. The sequences switches circuit is operable to select from among the plurality of vertical Hall elements, wherein each selected one of the plurality of vertical Hall elements comprises a respective plurality of active vertical Hall element contacts and at least one respective skipped contact, the at least one skipped contacts disposed between at least one respective pair of active vertical Hall element contacts. A position of the at least one skipped contact is selected to reduce an offset voltage of a respective one of the plurality of vertical Hall elements.

In another aspect, a method includes generating a plurality of magnetic field signals with a CVH sensing element, the CVH sensing element comprising a plurality of vertical Hall elements arranged over a common implant and diffusion region in a substrate and each magnetic field signal is responsive to a magnetic field. The method additionally includes selecting from among the plurality of vertical Hall elements, with each selected one of the plurality of vertical Hall elements comprising a respective plurality of active vertical Hall element contacts and at least one respective skipped contact, the at least one skipped contact disposed between at least one respective pair of active vertical Hall element contacts. A position of the at least one skipped contact is selected to reduce an offset voltage of a respective one of the plurality of vertical Hall elements.

BRIEF DESCRIPTION OF THE DRAWINGS

The foregoing features of the disclosure, as well as the disclosure itself may be more carefully understood from the following detailed description of the drawings, which:

FIG. 6 is a block diagrams illustrating a conventional vertical Hall element;

FIG. 6A is a block diagram of an exemplary five-contact vertical Hall element, showing spacing between vertical Hall element contacts of a five-contact vertical Hall element used in a CVH sensing element;

FIG. 7 is a block diagram showing an exemplary five-contact vertical Hall element that can be used within the CVH sensing element of FIG. 1, showing a plurality of active vertical Hall element contacts and also skipped contacts;

FIG. 7A is a block diagram illustrating selection of the vertical Hall element of FIG. 7 and surrounding circuitry in accordance with the exemplary magnetic field sensor of FIG. 3;

DETAILED DESCRIPTION

Figure 1:
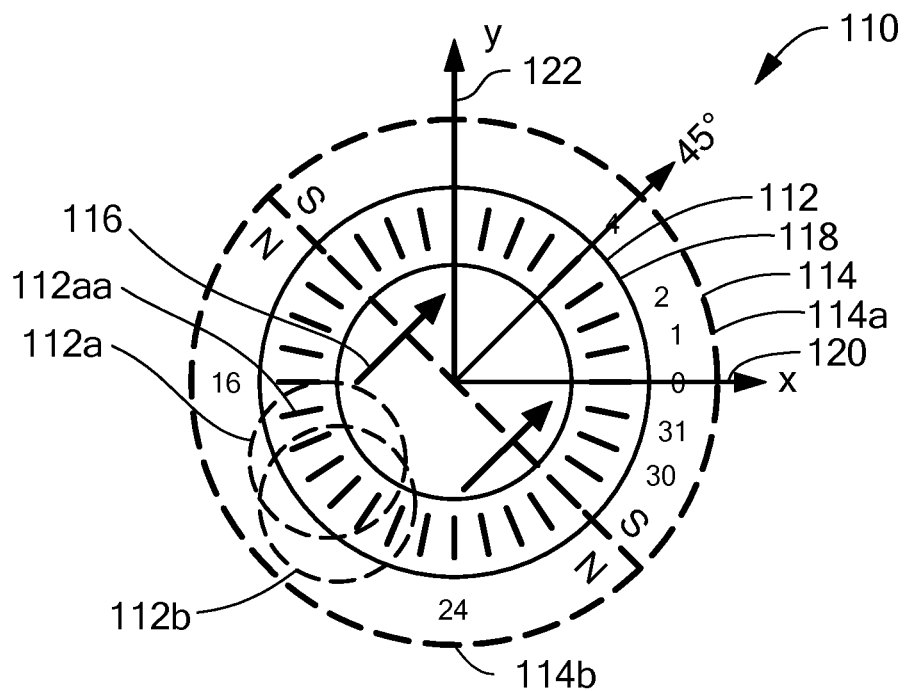
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

The features and other details of the disclosure will now be more particularly described. It will be understood that the specific embodiments described herein are shown by way of illustration and not as limitations of the broad concepts sought to be protected herein.

For convenience, certain introductory concepts and terms used in the specification are collected here.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "active" when referring to a vertical Hall element contact is used to describe a vertical Hall element contact that is coupled to receive a current into or out of the active vertical Hall element contact, or a vertical Hall element contact at which a signal is generated.

As used herein, the term "skipped" when referring to a vertical Hall element contact is used to describe a vertical Hall element contact that is not an active vertical Hall element contact. Generally, the skipped contact is floating and is not coupled to surrounding electronic circuits. The skipped contact may be an active vertical Hall element contact of an adjacent Hall element.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions). As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "Light-P" or simply "LP" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures fall into the following ranges:
substrate=about $1 \times 10^{15}$ P-type atoms per $cm^3$, for example, boron atoms.
epi=about $1 \times 10^{15}$ to about $6 \times 10^{15}$ N-type atoms per $cm^3$, for example, Arsenic atoms,
  where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).
P-well=about $1 \times 10^{17}$ P-type atoms per $cm^3$, for example, boron atoms.
LP=about $5 \times 10^{17}$ atoms per $cm^3$, for example, boron atoms.
PBL=about $1 \times 10^{18}$ to about $2 \times 10^{18}$ P-type atoms per $cm^3$, for example, boron atoms.
P+=about $3 \times 10^{19}$ to about $5 \times 10^{19}$ P-type atoms per $cm^3$, for example, boron atoms.

In some embodiments, the concentrations are outside of the above ranges or values, but within about +/−twenty percent of the above ranges or values.

Before describing the present disclosure, it should be noted that reference is sometimes made herein to assemblies having a particular shape (e.g., rectangular). One of ordinary skill in the art will appreciate, however, that the techniques described herein are applicable to a variety of sizes and shapes.

Referring to FIG. 1, a circular vertical Hall (CVH) element 112 includes a circular implant and diffusion region 118 in a substrate (not shown). The CVH sensing element 112 has a plurality of vertical Hall elements, of which a vertical Hall element 112a is but one example. In some embodiments, the common implant and diffusion region 118 can be characterized as a common epitaxial region upon a substrate, bounded by semiconductor isolation structures.

Each vertical Hall element has a plurality of Hall element contacts (e.g., four or five contacts), e.g., 112aa. Each vertical Hall element contact can be comprised of a metal contact over a contact diffusion region (a pickup) diffused into the common implant and diffusion region 118.

A particular vertical Hall element (e.g., 112a) within the CVH sensing element 112, which, for example, can have five adjacent contacts, can share some, for example, four, of the five contacts with a next vertical Hall element (e.g., 112b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 12a can positioned along an x-axis 120 and a center of vertical Hall element 118 can be positioned along a y-axis 122. In the exemplary CVH sensing element 112, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 114 having a north side 114b and a south side 114a can be disposed over the CVH 112. The circular magnet 114 tends to generate a magnetic field 116 having a direction from the north side 114b to the south side 114a, here shown to be pointed to a direction of about forty-five degrees relative to x-axis 120.

In some applications, the circular magnet 114 is mechanically coupled to a rotating target object, for example, an automobile steering shaft of an automobile camshaft, and is subject to rotation relative to the CVH sensing element 112. With this arrangement, the CVH sensing element 112, in combination with an electronic circuit described below, can generate a signal related to the angle of rotation of the magnet 114, i.e., an angle of rotation of the target object to which the magnet is coupled.

Figure 1A:
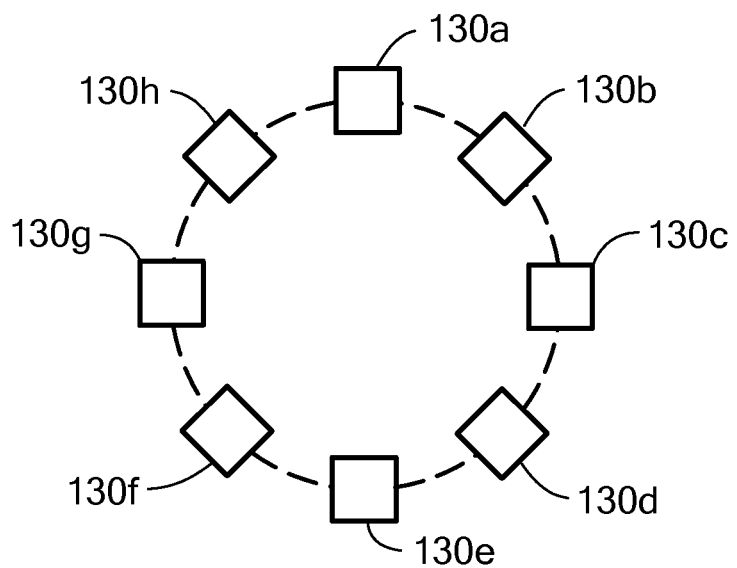
FIG. 1A is pictorial showing a plurality of magnetic field sensing elements.

Referring now to FIG. 1A, a plurality of magnetic field sensing elements 130a-130h, in a general case, can be any type of magnetic field sensing elements. The magnetic field sensing elements 130a-130h can be, for example, separate vertical Hall elements or separate magnetoresistance elements, each having an axis of maximum response parallel to a surface of a substrate 134, each pointing in a different direction in the plane of the surface. These magnetic field sensing elements can be coupled to an electronic circuit the same as or similar to electronic circuits described below in conjunction with FIG. 3. There can also be a magnet the same as or similar to the magnet 114 of FIG. 1 disposed proximate to the magnetic field sensing elements 130a-130h.

Figure 2:
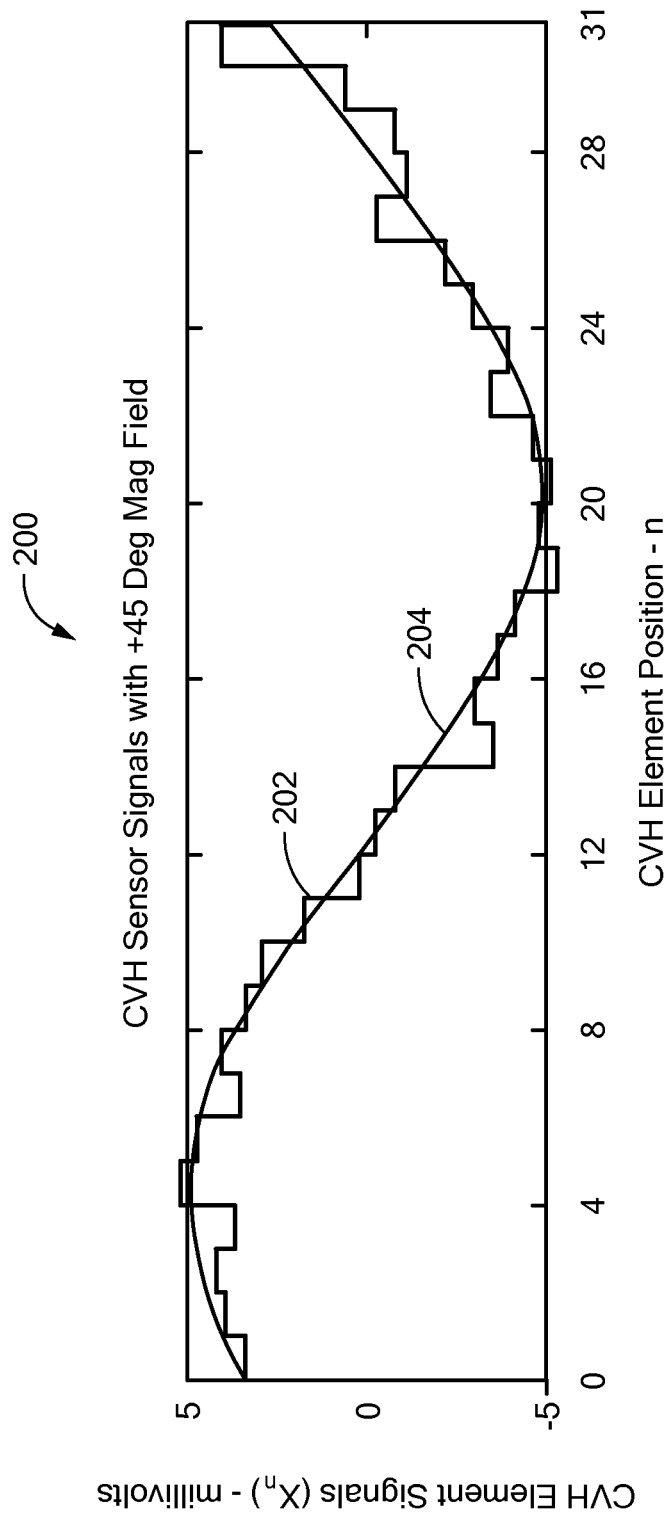
FIG. 2 is a graph showing an output signal as may be generated by the CVH sensing element of FIG. 1 or by the plurality of magnetic field sensing elements of FIG. 1A.

Referring now to FIG. 2, a graph 200 has a horizontal axis with a scale in units of CVH vertical Hall element position, n, around a CVH sensing element, for example, the CVH sensing element 112 of FIG. 1. The graph 200 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 200 includes a signal 202 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 120 and vertical Hall element 112a is centered along the y-axis 122. In the exemplary CVH sensing element 112, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 116 pointing at positive forty-five degrees, a maximum positive signal is achieved from a vertical Hall element centered at position n=4, which is aligned with the magnetic field 116 of FIG. 1, such that a line drawn between the vertical Hall element contacts (e.g., five contacts) of the vertical Hall element at position n=4 is perpendicular to the magnetic field. A maximum negative signal is achieved from a vertical Hall element centered at position 120, which is also aligned with the magnetic field 116 of FIG. 1, such that a line drawn between the vertical Hall element contacts (e.g., five contacts) of the vertical Hall element at position 120 is also perpendicular to the magnetic field.

A sine wave 202 is provided to more clearly show ideal behavior of the signal 204. The signal 202 has variations due to vertical Hall element offsets, which tend to cause corresponding variations of output signals causing them to be too high or too low relative to the sine wave 254, in accordance with offset errors for each element. The offset signal errors are undesirable.

Full operation of the CVH sensing element 112 of FIG. 1 and generation of the signal 252 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 202 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 202 when current spinning is not used. However, for embodiments in which current spinning is used, each step of the signal 202 can be comprised of several sub-steps (not shown, e.g., four sub-steps), each sub-step indicative of a current spinning "phase."

Current spinning and current spinning phases are described more fully below in conjunction with FIGS. 4-4C.

It will be understood that a phase of the signal 202 is related to an angle of the magnetic field 116 of FIG. 1 relative to position zero of the CVH sensing element 112. It will also be understood that a peak amplitude of the signal 202 is generally representative of a strength of the magnetic field 116. Using electronic circuit techniques described above in PCT Patent Application No. PCT/EP2008/056517, or using other techniques described below, a phase of the signal 202 (e.g., a phase of the signal 204) can be found and can be used to identify the pointing direction of the magnetic field 116 of FIG. 1 relative to the CVH sensing element 112.

The signal 202 is referred to herein as a "sequenced signal" 202, which will be understood to be comprised of sequential ones of a plurality of magnetic field signals, each magnetic field signal generated by a respective one of a plurality of magnetic field sensing elements, e.g., the plurality of vertical Hall elements within a CVH sensing element.

Figure 3:
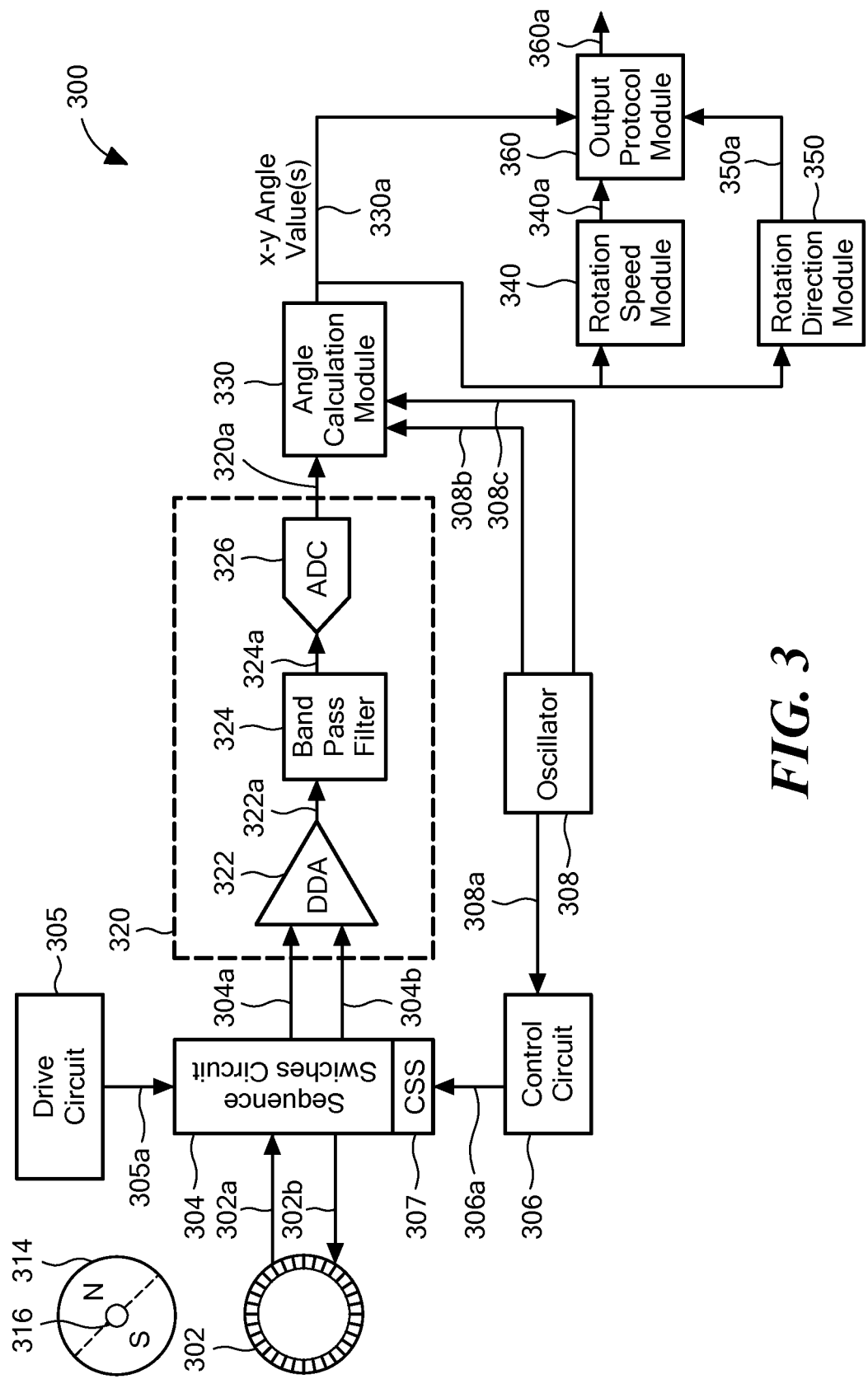
FIG. 3 is a block diagram of an exemplary magnetic field sensor having a CVH sensing element and circuitry, including selection circuitry, for providing the magnetic field sensor with reduced offset and improved accuracy.

Referring now to FIG. 3, an exemplary magnetic field sensor 300 with improved accuracy is shown. The magnetic field sensor 300 includes a CVH sensing element 302 having a plurality of vertical Hall elements arranged over a common implant and diffusion region in a substrate, with each vertical Hall element comprising a group of vertical Hall element contacts (e.g., thirty-two vertical Hall element contacts). In some embodiments, the CVH sensing element 302 can be the same as or similar to the CVH sensing element 112 described above in conjunction with FIG. 1. In one aspect the CVH sensing element 302 can be disposed proximate to a two pole magnet 344 coupled to a target object 346, which magnet 344 can be the same as or similar to the magnet 114 of FIG. 1. However, in other embodiments, the CVH sensing element 302 can be replaced by a group of magnetic sensing elements that are the same as or similar to those described above in conjunction with FIG. 1A.

The CVH sensing element 302 is configured to generate a plurality of magnetic field signals 302a by sequential selection of vertical Hall elements through a selection signal 302b, with each magnetic field signal being responsive to a magnetic field. Thus, the coupling through selection signal 302b can actually include a plurality of couplings to the plurality of vertical Hall elements within the CVH sensing element. In some embodiments, the plurality of vertical Hall elements can overlap and share one or more of the plurality of vertical Hall element contacts of an adjacent one of the one or more of the plurality of vertical Hall elements. Additionally, each active contact of the selected vertical Hall element can be associated with a respective vertical resistance and a horizontal resistance, as described more fully below in conjunction with FIGS. 6-9.

The CVH sensing element 302, more particularly the plurality of vertical Hall elements of the CVH sensing element 302, can be coupled to a sequence switches circuit 304 operable to sequence through the vertical Hall elements of the CVH sensing element 302 to generate a differential sequenced signal 304a, 304b. The differential sequenced signal 304a, 304b can be the same as or similar to the sequenced signal 202 of FIG. 2, for example. The current sequence switches circuit 304 can also be coupled to or can comprise current spinning or chopping switches (CSS) 307 for enabling the magnetic field sensor 300 to be operated according to current spinning techniques for reducing DC offset error, as described more fully below in conjunction with FIGS. 4-4C.

The sequence switches circuit 304 can additionally be coupled to a control circuit 306 configured to generate and couple a control signal 306a to the sequences switches circuit 304 and to the current spinning or chopping switches (CSS) 307. The control signal 306a may, for example, control and/or indicate switching (or indexing) or sequential selection from among the plurality of vertical Hall elements. The control signal 306b can also be indicative of which one of the vertical Hall elements within the CVH sensing element 302 is currently being processed, which can be synchronous with individual samples of the magnetic field signals within the differential sequenced signal 304a, 304b, i.e., synchronous with steps of the signal 202 of FIG. 2. The control circuit 306 can also be coupled to an oscillator 308 configured to provide a clock signal 308a to the control circuit 306 for sequential selection of sequential ones of the plurality of vertical Hall elements of the CVH sensing element 302.

The sequence switches circuit 304 can further be coupled to a drive circuit 305, which can be configured to generate one or more current signals 305a. The sequence switches circuit 304 can be coupled to receive the one or more current signals 305a and provide the current signals 305a to selected vertical Hall elements within the CVH sensing element 302.

The generated differential sequenced signal 304a, 304b can, for example, be coupled to a signal processing system 320 coupled to receive and process the differential sequenced signal 304a, 304b. The signal processing system 320 can, for example, comprise a dual-input differential amplifier (DDA) 322, a band-pass filter 324, and an analog-to-digital converter (ADC) 326. It is to be appreciated that signal processing system 320 is one of many signal processing systems that can be utilized for processing of the differential signal 304a, 304b.

The DDA 322 can, for example, be coupled to receive the differential sequenced signal 304a, 304b and configured to generate an amplified signal 322a. Additionally, the band-pass filter 324 can be coupled to receive the amplified signal 322a and configured to generate a filtered signal 324a. Furthermore, the ADC 326 can be coupled to receive the filtered signal 324a and configured to generate a converted digital signal 320a.

The signal processing system 320, particularly the ADC 326 of the signal processing system 320, can be coupled to an angle calculation module 330. The angle calculation module 330 can be coupled to receive the converted digital signal 320a and configured to generate an x-y angle signal 330a having x-y angle values indicative of the angle of the magnetic field generated by the magnet 314. The x-y angle signal 330a can change, and therefore, can be representative of a rotating magnetic field when the magnet 344 rotates.

The angle calculation module 330 can also be coupled to receive clock signals 308b, 308c from the oscillator 308. In some embodiments, in generating the x-y angle signal 330 the angle calculation module 330 compares a relative phase of the converted digital signal 320a with one or more of the clock signals 308b, 308c. In some embodiments, the x-y angle signal 330a is calculated through analysis of zero-crossings of the converted digital signal 320a received from the ADC 326 compared to transition edges of the clock signals 308b, 308c.

Exemplary circuits and associated methods disclosed in conjunction with FIGS. 6-9 for selection of vertical Hall element contacts of the CVH sensing element 302 can be found to reduce an angle error component of the x-y angle signal 330a. In operation, the x-y angle signal 330a would have a larger angle error component were it not for the exemplary circuits and associated methods disclosed herein. The angle error component is described more fully below in conjunction with FIG. 5. Let it suffice here to say that the angle error component is an angle error component that would otherwise cause the x-y angle signal 330a to not be perfectly representative of the true angle of the magnetic field generated by the magnet 314.

The angle calculation module 330 can be further coupled to a rotation speed module 340, a rotation direction module 350, and an output protocol module 360, each of which is coupled to receive the x-y angle signal 330a. The output protocol module 360 can be further coupled to receive a rotation speed signal 340a and a rotation direction signal 350a generated by the rotation speed module 340 and rotation direction module 350, respectively. The rotation speed signal 340a is indicative of a rotation speed of the magnet 314 while the direction signal 350a is indicative of a rotation of the magnet 314. The output protocol module 360 can be configured to generate an output signal 360a from said signals 330a, 340a, 350a representative of one or more of the angle of the magnetic field generated by the magnet 314, the speed of rotation of the magnet 314, or the direction of rotation of the magnet 314. The output signal 360a can also be generated in one of a variety of conventional formats, for example, an SPI format, a CAN format, an I2C format, or a Manchester format.

In operation and discussed further in conjunction with FIGS. 6-9, each one of the one or more of the plurality of vertical Hall elements can have at least one respective skipped contact disposed between at least one respective pair of active vertical Hall element contacts. A position of the at least one skipped contact can be selected to reduce an offset voltage of a respective one of the one or more of the plurality of vertical Hall elements. For example, the at least one skipped contact can comprise two skipped contacts, four skipped contacts, a pair of skipped contacts symmetrically surrounding a center active vertical Hall element contact of each one of the one or more of the plurality of vertical Hall elements, or a pair of skipped contacts, with each skipped contact of the pair being proximate to a last active vertical Hall element contact (e.g., contact 5 of a 5 contact vertical Hall element) of each one of the one or more of the plurality of vertical Hall elements.

In some embodiments, the at least one skipped contact can be selected from a non-adjacent one of the one or more of the plurality of vertical Hall elements. In other embodiments, the position of the at least one skipped vertical Hall element contact can be selected based upon a conformal mapping of a respective one of the one or more of the plurality of vertical Hall elements where a physical distance and resistance (vertical and horizontal) between the contacts of the one or more of the plurality of vertical Hall elements is unequal. The position of the at least one skipped contact, which in some embodiments can be a pair of skipped contacts, can also result in an increase in an inter-contact horizontal contact resistance. Circuits and associated methods of selecting the at least one skipped contact are discussed further in conjunction with FIGS. 6-9.

In operation, the magnetic field sensor 300 can reduce or equilibrate the offset of each vertical Hall element of the CVH sensing element 302, resulting in reduced error in the transfer characteristic (see, e.g., curves 506, 508 of FIG. 5 below) of the magnetic field sensor 300 due to factors such as temperature and mechanical stress, for example.

The magnetic field sensor 300 of FIG. 3 has been described as being comprised of units (e.g., the sequence switches circuit 304, the control circuit 306, and the oscillator 308). It should be appreciated, however, that this is merely a functional description and that software, hardware, or a combination of software and hardware can perform the respective functions of the magnetic field sensor 300 in an equivalent manner. The sequence switches circuit 304, for example, can comprise software, hardware, or a combination of software and hardware.

Additional aspects of the exemplary magnetic field sensor 300, with particular focus on the sequence switches circuit 304 and control circuit 306, are described in greater detail below in conjunction with FIGS. 6-9.

Figure 4:
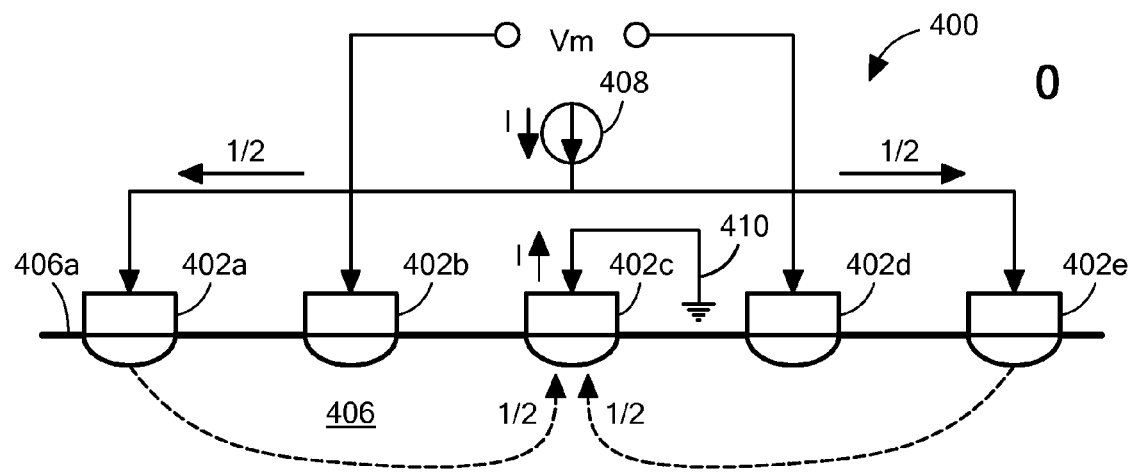
FIGS. 4-4C are block diagrams showing a vertical Hall element of the CVH sensing element of FIG. 3 when coupled into four current spinning phases, each phase associated with operation of one of the vertical Hall elements of the CVH sensing element of FIG. 3.
Figure 4A:
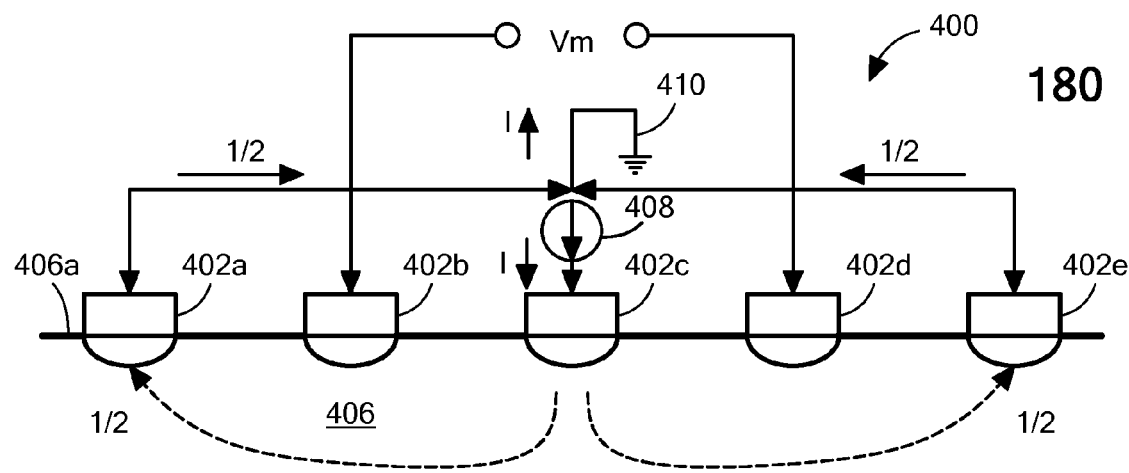
Figure 4B:
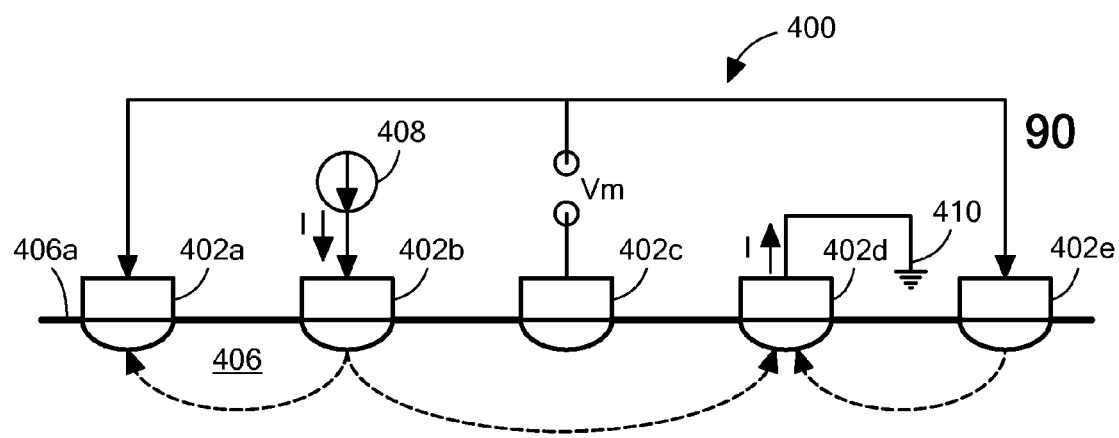
Figure 4C:
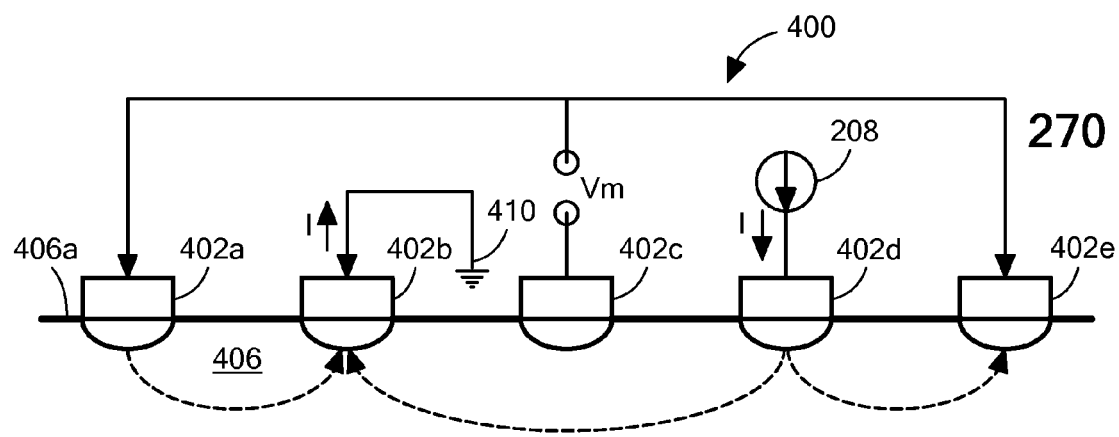

FIGS. 4-4C are representative of a four phase current spinning or chopping that can be used for any vertical Hall element having five contacts. Vertical Hall elements having only active vertical Hall element contacts (i.e., no skipped contacts) are shown in FIGS. 4-4C. It should be appreciated that such current spinning can be used for each selected vertical Hall element within the CVH sensing element 112 of FIG. 1 and the CVH sensing element 302 of FIG. 3. It should also be appreciated that such current spinning can also be used for separate magnetic field sensing elements, for example, the magnetic field sensing elements 130a-130h of FIG. 1A, where the magnetic field sensing elements 130a-130h are selected and chopped one of the time.

Orientation of current driven nodes and signal notes of FIGS. 4-4A are shown from the perspective of looking from outside of a ring of vertical Hall elements, e.g., from outside of a CVH sensing element. It will be understood that, naming conventions described below in terms of 0, 90, 180, and 270 degree phases are somewhat arbitrary. These naming conventions come from use of similar naming conventions used for planar Hall effect elements, where, during the sequence of current spinning, current is sequentially injected into nodes that are physically ninety degrees apart. There are no such physical angles that are ninety degrees apart for vertical Hall elements. Nevertheless, FIGS. 4, 4A, 4B, and 4C are referred to herein as zero, ninety, one hundred eighty, and two hundred seventy degrees phases, respectively.

Referring now to FIG. 4, a vertical Hall element 400 is comprised of five vertical Hall element contacts, namely, first, second, third, fourth, and fifth vertical Hall element contacts, 402a, 402b, 402c, 402d, 402e, respectively. In a first chopping or current spinning phase (zero degree phase), a drive circuit 408, which can be the same as or similar to the drive circuit 305 of FIG. 3, can be coupled to the first and fifth vertical Hall element contacts 402a, 402c, respectively, which are coupled together, and can provide a total current of I, half of the current, I/2, flowing to the first vertical a Hall element contact 402a and half of the current, I/2, flowing to the fifth vertical Hall element contact 402e. The third vertical Hall element contact 402c is coupled to a voltage reference 410, for example, ground. Currents from the current source 408 flow from the first and fifth vertical Hall element contacts 402a, 402e, respectively, through a substrate 406 (e.g., through an epitaxial layer upon a substrate) of the vertical Hall element 400 to the third vertical Hall element contact 402c, as represented by dashed lines.

A signal, Vm, responsive to an external magnetic field, results between the second and fourth vertical Hall element contacts 402b, 402d, respectively. Thus, in the first current spinning phase, current spinning switches (e.g., 307 of FIG. 3) can select the second and fourth vertical Hall element contacts 402b, 402d to provide an output signal, and can select the first, fifth, and third vertical Hall element contacts 402a, 402e, 402c, respectively, as those contacts coupled to the drive circuit 305 of FIG. 3. Couplings during other current spinning phases described below will be apparent.

Referring now to FIG. 4A, in which like elements of FIG. 4 are shown having like reference designations, in a second current spinning phase (one hundred eighty degree phase) of the same vertical Hall element 400 (same five vertical Hall element contacts), couplings are changed by current spinning switches (e.g., 307 of FIG. 3). In the second phase, the current source 408 is coupled to the third vertical Hall element contact 402c, and the first and fifth vertical Hal element contacts 402a, 402e, respectively, are coupled together and to the reference voltage 410. Thus, the currents flow through the substrate 406 in opposite directions from those shown in FIG. 4.

As in FIG. 4, a signal, Vm, responsive to an external magnetic field, results between the second and fourth vertical Hall element contacts, 402b, 402d, respectively. The signal, Vm, of FIG. 4A is like the signal, Vm, of FIG. 4. However, the offset voltage within the signals can be different, e.g., different in sign.

Referring now to FIG. 4B, in which like elements of FIGS. 4 and 4A are shown having like reference designations, in a third current spinning phase (ninety degree phase) upon the same vertical Hall element 400 (same five vertical Hall element contacts), couplings are again changed by current spinning switches (e.g., 307 of FIG. 3). In the third phase, the current source 408 is coupled to the second vertical Hall element contact 402b, and the fourth vertical Hall element contact 402d is coupled to the reference voltage 410. Thus, a current flows from the second vertical Hall element contact 402b through the substrate 406 to the fourth vertical Hall element contact 402d.

The first and fifth vertical Hall element contacts 402a, 402e, respectively, are coupled together. Some current also flows from the second vertical Hall element contact 402b through the substrate 406 to the first vertical Hall element contact 402a and through the mutual coupling to the fifth vertical Hall element contact 402c. Some current also flows from the fifth vertical Hall element contact 402e through the substrate 406 to the fourth vertical Hall element contact 402d.

A signal, Vm, responsive to an external magnetic field, results between the first vertical Hall element contact 402a first (and the fifth vertical Hall element contact 402e) and the third vertical Hall element contact 402c. The signal, Vm, of FIG. 4B is like the signal, Vm, of FIGS. 4 and 4A. However, the offset voltage within the signal can be different.

Referring now to FIG. 4C, in which like elements of FIGS. 4-4B are shown having like reference designations, in a fourth chopping phase (two hundred seventy degree phase) upon the same vertical Hall element 400 (same five vertical Hall element contacts), couplings are again changed by current spinning switches (e.g., 307, FIG. 3). In the fourth phase, the current is reversed from that shown in FIG. 4B. The current source 408 is coupled to the fourth vertical Hall element contact 402d, and the second vertical Hall element contact 402b is coupled to the reference voltage 410. Thus, a current flows from the fourth vertical Hall element contact 402*d* through the substrate 406 to the second vertical Hall element contact 402*b*.

The first and fifth vertical Hall element contacts 402*a*, 402*e*, respectively, are coupled together. Some current also flows from the fourth vertical Hall element contact 402*d* through the substrate 406 to the fifth vertical Hall element contact 402*e*, through the mutual coupling to the first vertical Hall element contact 402*a*. Some current also flows from the first vertical Hall element contact 402*a* through the substrate 406 to the second vertical Hall element contact 402*b*.

A signal, Vm, responsive to an external magnetic field, results between the first vertical Hall element contact 402*a* (and the fifth vertical Hall element contact 402*e*) and the third vertical Hall element contact 402*c*. The signal, Vm, of FIG. 4C is like the signal, Vm, of FIGS. 4-4B. However, the offset voltage within the signal can be different.

The signals, Vm, provided by the four phases of chopping of FIGS. 4-4C are responsive to an external magnetic field.

As described above, after generating the four current spinning phases on any one vertical Hall element within the CVH sensing element 402, by sequencing operation of the sequence switches circuit 304 of FIG. 3, the current spinning arrangements of FIGS. 4-4C can move to a next vertical Hall element, e.g., five vertical Hall element contacts offset by one vertical Hall element contact from those shown in FIGS. 4-4C, and the four current spinning phases can be performed on the new vertical Hall element by operation of current spinning switches.

Figure 5:
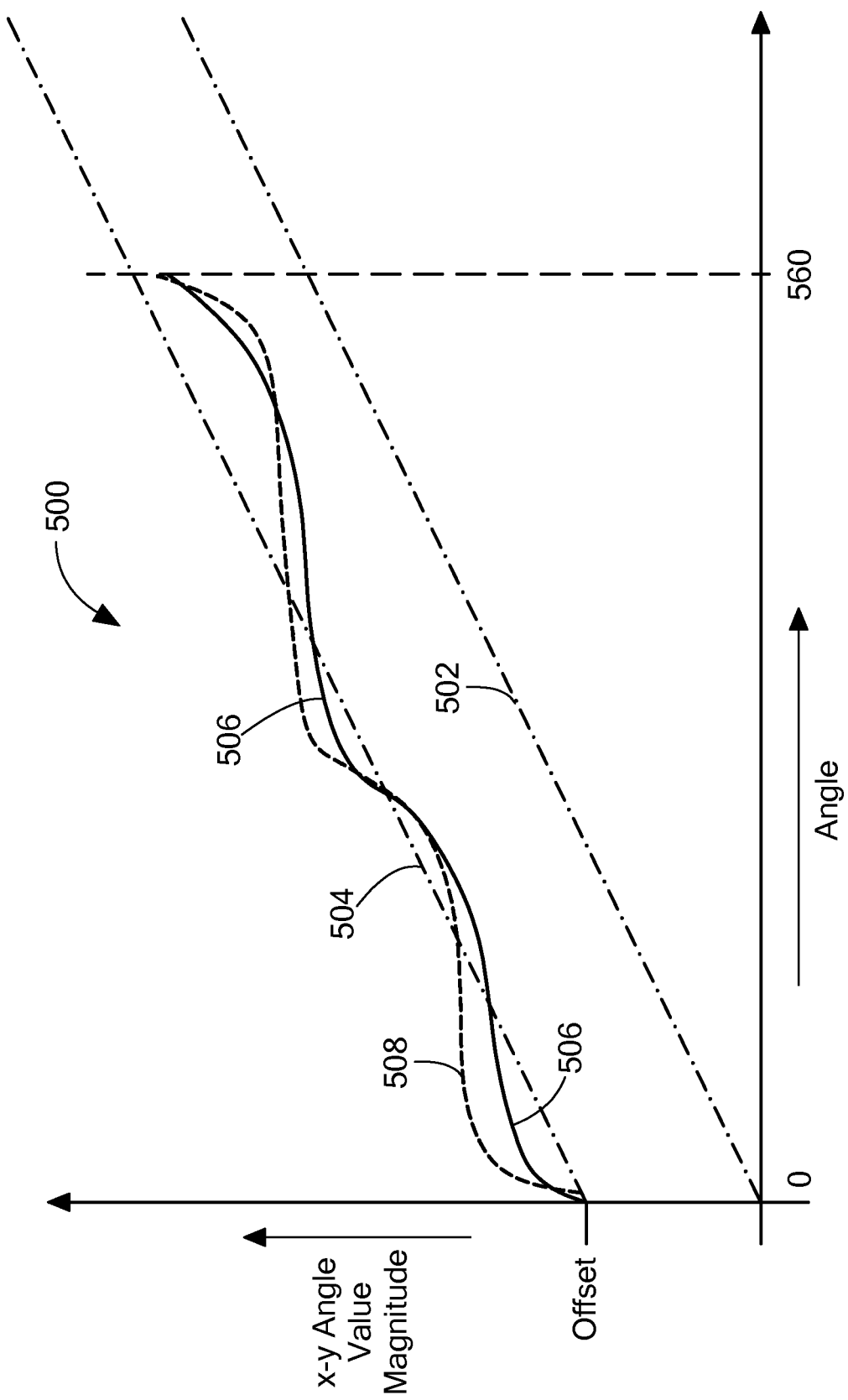
FIG. 5 is a graph showing ideal and non-ideal operation of the magnetic field sensor of FIG. 3.

Referring now to FIG. 5, a graph 500 has a horizontal axis with a scale in units of angular degrees and a vertical axis with a scale in units of value of an x-y angle value magnitude, for example, a magnitude of the x-y angle signal 330*a* of FIG. 3.

A line 502 is representative of an x-y angle value that has no angle error. When the x-y angle value has no angle error, the x-y angle value is perfectly linear with respect to actual angle, i.e., the x-y angle value is a perfect and true representation of the angle of the magnetic field generated by the magnet 314 of FIG. 3, and the line 502 passes through zero.

A line 504 is representative of an x-y angle value that has only an average or DC angle error, such that all angles represented by the x-y angle value are offset by a fixed number of degrees. The line 504 does not pass through zero.

A curve 506 is representative of an x-y angle value that has errors in representation of the true angle of the magnetic field generated by the magnet 314, average or DC errors and also an error that has a sinusoidal appearance.

A curve 508 is representative of an x-y angle value that has other errors in representation of the true angle of the magnetic field generated by the magnet 314.

A variety of circuit characteristics of the magnetic field sensor 100 contribute to the errors, i.e., to both the DC (or average) angle error represented by the curves 506, 508, and to the sinusoidal shapes of the curves 506, 508. One factor that contributes to the errors is switching noise generated by the sequence switches circuit 304 and/or by the current switches circuit 307 of FIG. 3. Another factor is different offset voltages among the vertical Hall elements within the CVH sensing element 302, for example, different offset voltages described above in conjunction with the signal 202 of FIG. 2. Another factor is different sensitivities of the various vertical Hall elements.

First, regarding the sequence switches circuit 304, it will be understood that charge injection or switching spikes (together referred to as noise) generated by the sequence switches 304 are not necessarily exactly the same as each sequential vertical Hall element is selected in the CVH sensing element 302. When the noise generated by the sequence switches 304 is not the same as each vertical Hall element is selected, a DC (or average) angle error is generated and also a sinusoidal type error such as that represented by the curves 506, 508. The sinusoidal error characteristic can be, in part, a result of the noise generated by the sequence switches being repetitive for each cycle around the CVH sensing element 302, and thus, the noise will have an angle error frequency component at a frequency of the signal 202 of FIG. 2, and will add to the signal 202 (304*a*, 304*b* of FIG. 3). The angle error frequency component is essentially fixed in phase relative the signal 304*a*, 304*b*, and therefore, the addition of the angle error causes different phase shift errors in the summed signal depending on the phase of signal 304*a*, 304*b*. Higher harmonics can also result from the noise.

Next, regarding the current switches circuit 307, it will be understood that charge injection or switching spikes (together referred to as noise) generated by the current switches circuit 307 are not necessarily exactly the same as each sequential vertical Hall element is selected in the CVH sensing element 302. When the noise generated by the current switches circuit 307 is not the same as each vertical Hall element is selected, a DC (or average) angle error is generated and also a sinusoidal type error such as that represented by the curves 506, 508. The sinusoidal error characteristic can, in part, result from the noise generated by the current switches circuit 307 being repetitive for each cycle around the CVH sensing element.

Other circuit characteristics can also contribute to the angle errors, i.e., to both the DC (or average) angle error represented by the error curves 506, 508, and to the sinusoidal shapes of the error curves 506, 508. Namely, a speed with which the dual differential amplifier 322 of FIG. 3, and also other circuit elements of FIG. 3, are unable to settle to final values as the sequence switches circuit 304 switches among the vertical Hall elements of the CVH sensing element 302, and also as the current switches circuit 307 switch among the various current spinning phases, contribute to the errors.

The above-described circuit characteristics, including, but not limited to, different offset voltages of the various vertical Hall elements within the CVH sensing element 302 of FIG. 3 (including or not including offset mismatches at different current spinning phases), differences of sensitivities of the various vertical Hall elements, and switching noise and lack of circuit elements settling to final values, tend to be influenced by (i.e., changed by) a variety factors including, but not limited to, temperature of the magnetic field sensor 300 of FIG. 3, a rate of sequencing around the CVH sensing element 302, peak magnitude of the magnetic field experience by the CVH sensing element 302 as the magnet 314 rotates, and selected current spinning sequence(s) among the various vertical Hall elements.

Differences between the curves 506, 508 can be attributed to changes in the same factors, namely, changes in the temperature, changes in or differences in peak amplitude of the magnetic field experience by the CVH sensing element 302 as the magnet 314 rotates, changes in offset voltages of the vertical Hall elements within the CVH sensing element 302, changes of sensitivities of the various vertical Hall elements, changes in or differences in rates of sequencing around the CVH sensing element 302, and changes in or differences in selected current spinning sequence(s) among the various vertical Hall elements within the CVH sensing element 302. Among these factors, it will be understood that the changes in the temperature can occur at any time. The changes in the peak amplitude of the magnetic field can be influenced by positional changes, i.e., air gap changes, between the magnet 314 and the CVH sensing element 302 of FIG. 3. The changes in the peak amplitude of the magnetic field can also be influenced by mechanical considerations, for example, wear of a bearing or the shaft 316 upon which the magnet 314 rotates. However, the changes in sequencing rates and the changes in current spinning sequences can be fixed, and changed only for different applications of the magnetic field sensor 300. The changes in offset voltages and changes in sensitivity of the vertical Hall elements tend to be influenced by changes in temperature.

In general, it has been determined that the dominant angle error frequency components occur at first and second harmonics of the frequency of the signal 202 (i.e., differential sequence signal 304*a*, 304*b*). The curves 506, 508 are representative of angle error functions dominated by first and second harmonics of the frequency of the signal 202 (i.e., 304*a*, 304*b*).

As temperature varies, each harmonic component of the angle error represented by curves 506, 508 can change independently in amplitude and phase.

Referring now to FIGS. 6 and 6A, shown are example vertical Hall elements that can be part of a CVH sensing element (e.g., CVH sensing element 302 of FIG. 3). As is known, a CVH sensing element typically comprises an n-doped ring with N contacts (e.g., 32 or 64) equally distributed on a ring surface at the cult ring element. A plurality of n contacts (e.g., 5) of the CVH sensing element can be connected in such a way to form an n-contact vertical Hall element (e.g., 5-contact vertical Hall element). As such, a CVH sensing element comprises a plurality of vertical Hall elements.

FIG. 6, for example, is representative of a conventional vertical Hall element 602. As illustrated, the vertical Hall element 602 comprises a plurality of equidistant (denoted by "d1") contacts (e.g., 5), here labeled 602*a*-602*e* with the labels being comparable in other figures below. The equidistant contacts 602*a* and 602*e* provide for a geometrically symmetrical vertical Hall element 602 for sensing or measuring the strength and/or the direction of a magnetic field. However, electrical asymmetry exists in the vertical Hall element 602 due to inherent junction-field-effects where an active volume within the substrate of the vertical Hall element is confined by reverse biased p-n junctions to form an isolating depletion later. As a consequence, an output signal of the vertical Hall element 602 possesses an offset error in the absence of a magnetic field. Another consequence is a larger offset error in the output signal of the vertical Hall element 602 in comparison to its planar Hall element counterpart. As is known, a vertical Hall element can be theoretically related to a planar Hall element by means of a conformal (mathematical) mapping (i.e., relative angles of the planar Hall element are preserved), providing a means for analyzing a vertical Hall element in terms of known properties of its planar Hall element counterpart. Such can be helpful in characterizing the vertical Hall element 602.

Referring now to FIG. 6A, a vertical Hall element 612 has unequal contact spacing representative of skipped contacts described more fully below. Contacts can be skipped, for example, to account for the electrical asymmetry of conventional vertical Hall element 602 of FIG. 6 discussed above. Skipping contacts causes the distance d2, d3 between the contacts of the vertical Hall element, here labeled 612*a*-612*e*, to be different than a spacing of contacts in a conventional vertical Hall element 602. A greater distance between contacts 612*a*, 612*b* and 612*d*, 612*c* can, for example, result in a greater vertical and horizontal resistance between said contacts and thus provide more control over the offset error, as discussed further in conjunction with FIGS. 7-9.

It is to be appreciated that while the vertical Hall elements of FIGS. 6 and 6A are shown comprising n=5 active contacts, other vertical Hall elements can comprise, n=4, n=6, or an even higher or lower number of n active contacts.

Referring now to FIG. 7, a vertical Hall element 702 and a vertical Hall element 702' can be representative of one of the vertical Hall elements within the CVH sensing element 302 of FIG. 3. The vertical Hall element 702 comprises a group of active vertical Hall element contacts (e.g., five active vertical Hall element contacts), here denoted by b, d, e, f, h, and a group of skipped contacts (e.g., two skipped contacts), here denoted by c, d. The vertical Hall element 702', in contrast, is representative of a vertical Hall element comprising either a larger group of active vertical Hall element contacts (e.g., seven active vertical Hall element contacts) or a larger number of skipped contacts (e.g., four skipped contacts) than the vertical Hall element 702. For example, where the vertical Hall element has seven active contacts, active contacts are denoted by a, b, d, e, f, h, i, and a group of skipped contacts (e.g., two skipped contacts) are denoted by c, d. Where the vertical Hall element has five active contacts, active contacts are denoted by a, d, e, f, i, and two groups of skipped contacts (e.g., four skipped contacts) are denoted by b, c and g, h.

Additional vertical Hall element configurations are discussed in conjunction with FIGS. 7B-7E. As discussed with respect to FIG. 6, a larger number of skipped contacts results in a greater distance between vertical Hall element contacts and results in a greater horizontal resistance between active contacts, between which there are skipped contacts.

Referring now to FIG. 7A, shown is a vertical Hall element 712 in a the first chopping or current spinning phase of FIG. 4, as coupled to a drive circuit 705, control circuit 706, and a sequence switches circuit 704 comprising current spinning or chopping switches (CSS) 707. The vertical Hall element 712 can be the same as or similar to vertical Hall elements 702 and 702' of FIG. 7 or a vertical Hall element of the CVH sensing element 302 of FIG. 3, for example. Additionally, the drive circuit 705, the control circuit 706, the sequence switches circuit 704, and the current spinning or chopping switches (CSS) 707 can be the same as or similar to the drive circuit 305, the control circuit 306, the sequences switches circuit 304, and the current spinning or chopping switches (CSS) 307 of FIG. 3.

The sequence switches circuit 704 is coupled to receive one or more current signals 705*a* from the drive circuit 705 and coupled to provide said signals 705*a* to vertical Hall element 712, as represented by drive signals 712*a*, 712*b*. Additionally, the sequence switches circuit 704 is coupled to receive a control signal 706*a* from the control circuit 706 and coupled to use said signal 706*a* in selecting a vertical Hall element 712 and select contacts of said vertical Hall element 712.

As shown, the vertical Hall element 712 is comprised of five active vertical Hall element contacts, namely, first, second, third, fourth, and fifth vertical Hall element contacts b, d, e, f, and h, respectively and two skipped contacts c, g. In the first chopping or current spinning phase, similar to first chopping or current spinning phase of FIG. 4, the drive signals 712*a*, 712*b* are coupled to the first and fifth vertical Hall element contacts b, h, respectively. The sequence switches circuit 704 can provide a total current of I through drive signals 712*a*, 712*b*, half of the current, I/2, flowing to the first vertical Hall element contact b and half of the current, I/2, flowing to the fifth vertical Hall element contact h. The third vertical Hall element contact e is coupled to a voltage reference, for example, ground. Currents from the drive signals 712*a*, 712*b* flow from the first and fifth vertical Hall element contacts b, h, respectively, through a substrate (e.g., through an epitaxial layer upon a substrate) of the vertical Hall element 712 to the third vertical Hall element contact e.

A signal, Vm, responsive to an external magnetic field, results between the second and fourth vertical Hall element contacts d, f, respectively. Thus, in the first current spinning phase, current spinning switches can select the second and fourth vertical Hall element contacts d, f to generate a differential sequenced signal 704*a*, 704*b*. Couplings during other current spinning phases described above in conjunction with FIGS. 4A-4C will be apparent.

As illustrated, the vertical Hall element 712 comprises a plurality of skipped contacts c, g, with the number and position of the skipped contacts being selected to optimally reduce the offset error of the vertical Hall element 712. Optionally, as discussed above in conjunction with FIG. 7, in another five active contact vertical Hall element arrangement, contacts a, d, e, f and i may be active vertical Hall element contacts and contacts b, c, g and h may be skipped contacts. The active contacts a and i can be coupled to receive the drive signals 712*a*, 712*b* instead of the contacts b and h. Still further, in a seven contact vertical Hall element arrangement, contacts a, b, d, e, f, h, i may be active vertical Hall element contacts and contacts c and g may be skipped contacts. Other contacts of the vertical Hall element 712 may be selected as either skipped contacts or active vertical Hall element contacts. The skipped contacts and active vertical Hall element contacts can be selected in accordance with the control signal 706*a* provided by the control circuit 706, for example.

By skipping one or more contacts and thereby increasing horizontal resistance between the select contacts of the vertical Hall element 712, for reasons described more fully below, offset error resulting from each vertical Hall element within the CVH sensing element can be reduced. Accordingly, the first harmonic angular component described above in conjunction with FIG. 5 can be reduced. As described above, the first harmonic angular component directly impacts angle error of the magnetic field sensor 300 of FIG. 3, since it adds to the sensed magnetic field signal. In other words, performance of a CVH element based angle sensor utilizing the proposed skipped contact arrangement will have a smaller angle error than conventional CVH element based angle sensors.

In alternate embodiments, signal Vm can result between a select two or more active contacts of vertical Hall element 712. Additionally, in alternate embodiments, the sequences switches circuit 704 can be configured to select contacts of vertical Hall element 712 of the CVH sensing element in a non-adjacent way, such that symmetry of the overall CVH sensing element is optimized. It is to be appreciated that a more electrically symmetric vertical Hall element generally corresponds to a vertical Hall element with a reduced offset error, which can in turn result in a CVH sensing element with a reduced offset error.

Furthermore, it is to be appreciated that, in a first chopping phase of a conventional five active contact vertical Hall element, like vertical Hall element 602 of FIG. 6, a sequential first and fifth contact of the vertical Hall element are selected as driven contacts (i.e., active contacts to be driven by a current or voltage source). The present disclosure, however, teaches an exemplary vertical Hall element, like vertical Hall element 612 of FIG. 6A, where the first and fifth contacts selected as driven contacts are not necessarily sequential first and fifth contacts of the vertical Hall element. Rather, the driven first and fifth contacts of the vertical Hall element, in some embodiments, have skipped contacts between the driven first and fifth contacts such that the offset of the vertical Hall element, like the vertical Hall element 712, is reduced.

For five active contact vertical Hall elements within a CVH sensing element, in different embodiments, the number and position of skipped contacts existing between the first and fifth active contacts can be different. Typically, there will be at least 1 or 2 skipped contacts in each vertical Hall element, but it is not so limited.

Mathematically it can be demonstrated that a vertical Hall element with skipped contacts maps via conformal mapping to a more symmetric planar counterpart, and thus has a reduce offset. It is to be appreciated that associated current spinning methods for vertical Hall elements comprising skipped contacts, like vertical Hall element 612 of FIG. 6A, can be performed in a substantially similar manner as conventional vertical Hall elements that have no skipped contacts like the vertical Hall element 602 of FIG. 6

Figure 7B:
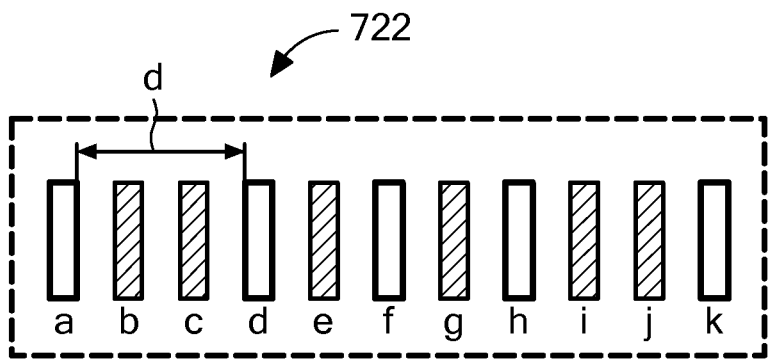
FIGS. 7B-7E are block diagrams showing exemplary alternative three, five, and seven contact vertical Hall elements that can be used within the CVH sensing element of FIG. 1, showing pluralities of active vertical Hall element contacts and also skipped contacts.
Figure 7C:
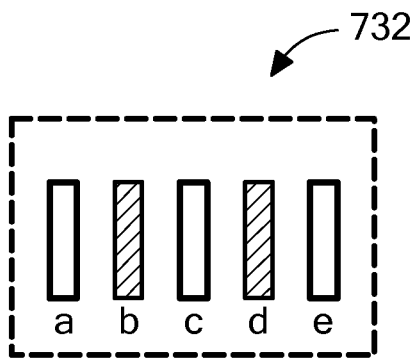
Figure 7D:
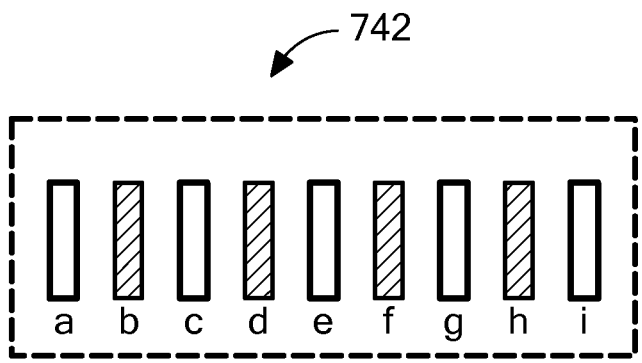
Figure 7E:
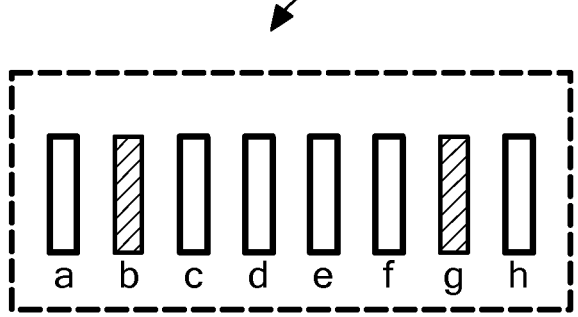

Referring now to FIGS. 7B-7E, shown are alternate vertical Hall element arrangements. A vertical Hall element can, for example, comprise n=5 active vertical contacts, as shown in FIGS. 7B and 7D, n=3 active vertical Hall contacts, as shown in FIG. 7C, or n=6 active vertical Hall contacts, as shown in FIG. 7E. In still other embodiments, any number n of active vertical Hall contacts as are possible.

Illustrated in FIG. 7B, for example, is a vertical Hall element 722 comprising five active vertical Hall contacts (a, d, f, h, k) and five skipped contacts (b, c, e, g, i, j). Additionally, illustrated in FIG. 7C is a vertical Hall element 732 comprising three active vertical Hall contacts (a, c, e) and two skipped contacts (b, d). Additionally, illustrated in FIG. 7D is a vertical Hall element 742 comprising five active vertical Hall contacts (a, c, e, g, i) and four skipped contacts (b, d, f, h). Additionally, illustrated in FIG. 7E is a vertical Hall element 752 comprising six active vertical Hall contacts (a, c, d, e, f, h) and two skipped contacts (b, g).

According to some embodiments, a distance d between active vertical Hall contacts (as depicted in vertical Hall element 722 of FIG. 7B) is less than a depth of the substrate of the vertical Hall element. More details on the substrate of vertical Hall elements are described below in conjunction with FIG. 9.

It is to be appreciated that the vertical Hall element configurations shown in FIGS. 7B-7E are non-limiting example vertical Hall elements, and vertical Hall elements can have other numbers of active vertical Hall element contacts and other numbers of skipped contracts. Also, the active vertical Hall contacts and the skipped contacts of the vertical Hall elements of FIGS. 7B-7E can have equal or different physical distances between the vertical Hall contacts and skipped contacts.

Figure 8:
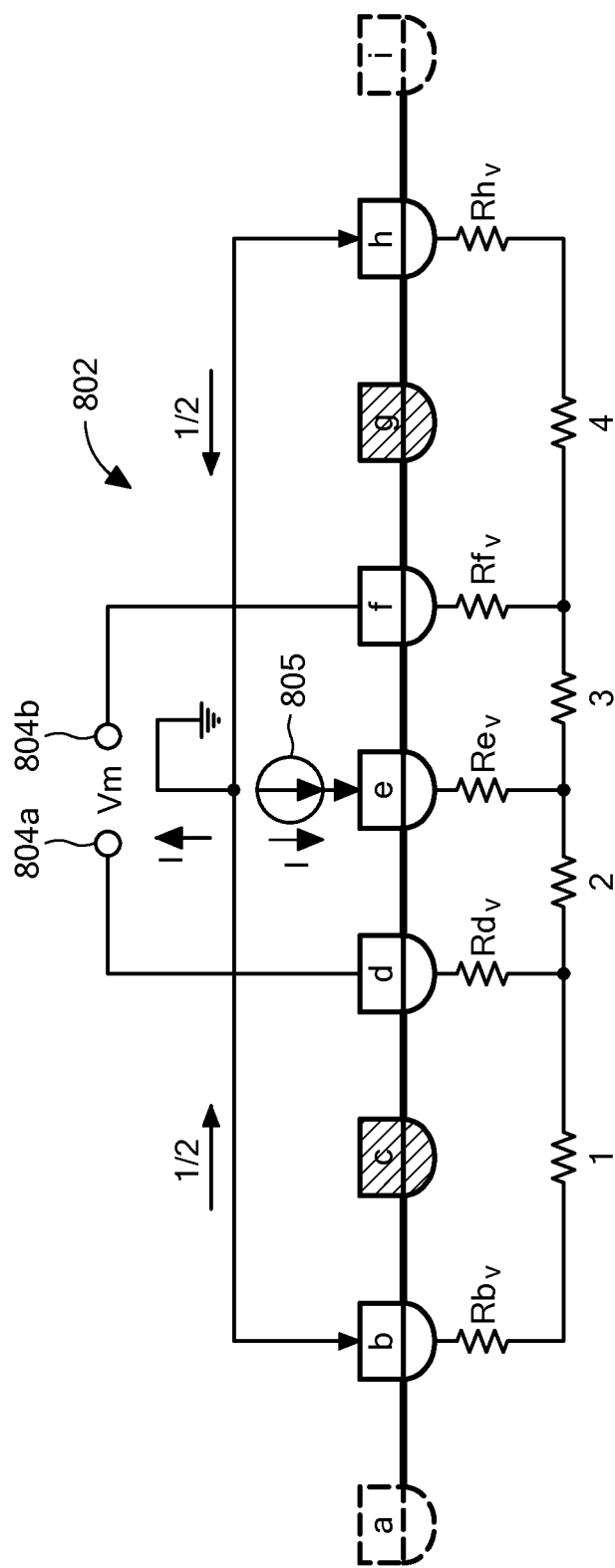
FIG. 8 is a block diagram illustrating the vertical Hall element of FIG. 7A in a second current spinning phase with each active contact of the vertical Hall element comprising a vertical resistance and a horizontal resistance.

Referring now to FIG. 8, in which like elements of FIG. 7A are shown having like reference designations, the vertical Hall element 802 is illustrated fixed in a second current spinning phase, like that of FIG. 4A. Resistors 1, 2, 3, and 4 are shown between each adjacent pair of active vertical Hall element contacts b-d, d-e, e-f, f-h, respectively, and are representative of the horizontal resistance of said vertical Hall element 802.

Additionally, as illustrated, each active contact b, d, e, f, h of vertical Hall element 802 comprises a vertical resistance, as indicated by $Rb_v$, $Rd_v$, $Re_v$, $Rf_v$, and $Rh_v$. Physical meanings of vertical and horizontal resistances are described below in conjunction with FIG. 9. However, let it suffice here to say that the vertical and horizontal resistances correspond to respective resistances experiences by currents passing through a epitaxial layer described more fully below in conjunction with FIG. 9. As is known, the vertical and horizontal resistances may vary based upon a wide variety of factors including composition of the epitaxial material and temperature thereof.

As apparent, a magnitude of the horizontal resistance associated with the vertical Hall element 802 is affected by skipped contacts c, g. Skipped contacts c, g also affect a common-mode voltage of an output signal, Vm, as described more fully below in conjunction with FIG. 8A. In contrast, the vertical resistances $Rb_v$, $Rd_v$, $Re_v$, $Rf_v$, and $Rh_v$ associated with the vertical Hall element 802 are not substantially affected by the skipped contacts, d, g.

Figure 8A:
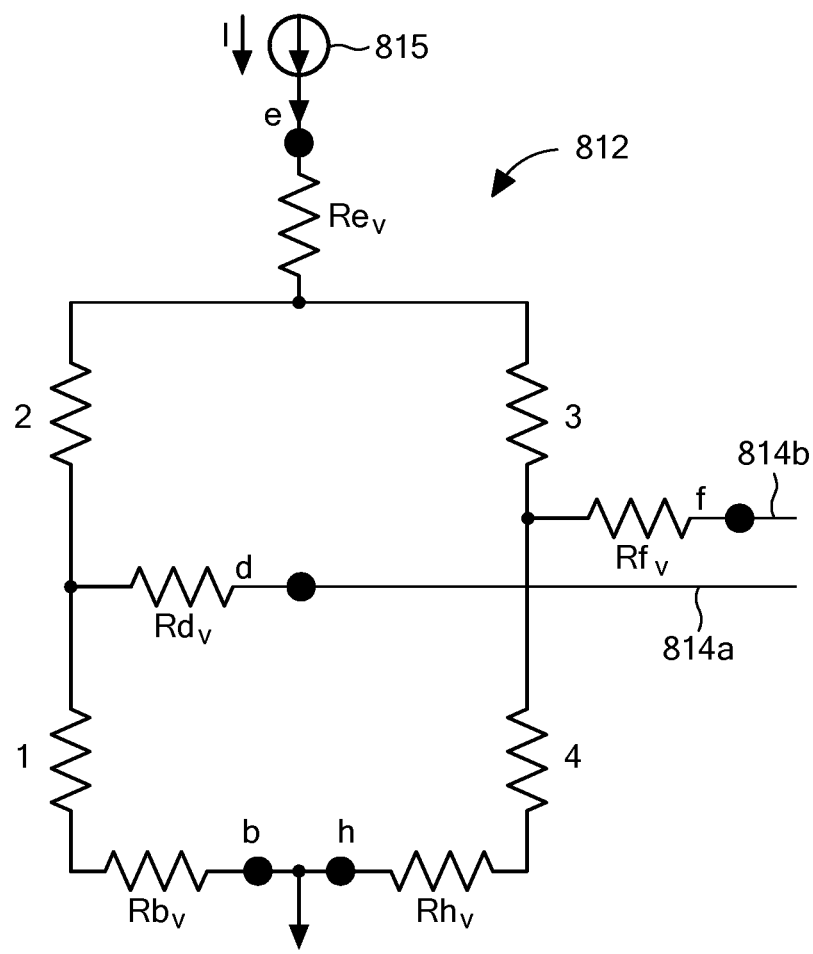
FIG. 8A is a schematic showing an equivalent circuit of the vertical Hall element of FIG. 8.

Referring now to FIG. 8A, in which like elements of FIG. 8 are shown having like reference designations, an equivalent circuit 812 of the vertical Hall element 802 of FIG. 8 is illustrated. Resistors 1, 2, 3, and 4, which are representative of horizontal resistances, are coupled to active vertical Hall element contacts b, d, e, f h, respectively. In particular, a first resistive element 1 is coupled indirectly between active contacts b and d, a second resistive element 2 is coupled indirectly between active contacts d and e, a third resistive element 3 is coupled indirectly between active contacts e and f, and a fourth resistive element 4 is coupled indirectly between active contacts f and h. Additionally, resistors $Rb_v$, $Rd_v$, $Re_v$, $Rf_v$, and $Rh_v$, which are representative of vertical resistances, are coupled to t active vertical Hall contacts b, d, e, f h, respectively.

The vertical Hall element 812 can be driven by one or more current sources 815. In the embodiment shown, the one or more current sources 815 are coupled to active contact e of vertical Hall element 812, but it is not so limited. A differential output signal 814a, 814b of equivalent circuit 812 is generated at active contacts d and f.

As will be apparent, the skipped contacts c and g of FIG. 8, due to increase spacing between surrounding active contacts, tend to result in horizontal resistances 1 and 4 being larger than the horizontal resistances 2 and 3. However, the vertical resistances $Rb_v$, $Rd_v$, $Re_v$, $Rf_v$, and $Rh_v$ are not substantially influenced by the skipped contacts c and g. As discussed above, by skipping contacts, the offset error of the vertical Hall element 802 can be reduced.

By inspection of the equivalent circuit 812, it will be understood that larger resistances 1 and 2 tend to make a common mode voltage in the differential signal 814a, 814b move upward in voltage.

Offset voltage in the differential signal 814a, 814b results when, in the presence of a zero magnetic field, resistors $Rb_v$ and $Rh_v$ do not match and/or resistors 1 and 4 do not match. At any particular temperature, a mismatch of resistors $Rb_v$ and $Rh_v$ with respect to resistors 1 and 4, or vice versa, can take the form of a particular mismatch resistance, e.g., one ohm.

Resistors $Rb_v$ and $Rh_v$ are of a different nature than resistors 1 and 4 (i.e., resistors $Rb_v$ and $Rh_v$ are representative of vertical resistances, while resistors 1 and 4 are representative of horizontal resistance). Being of a different nature, resistors $Rb_v$ and $Rh_v$ tend to have a larger mismatch than resistors 1 and 4 and than resistors 2 and 3. However, where resistors $Rb_v$ and $Rh_v$ do not match (e.g., by one ohm), it will be understood that larger resistances 1 and 4 tend to make the mismatch of resistors $Rb_v$ and $Rh_v$ have a smaller impact on the differential signal 814a, 814b, i.e., resulting in a smaller offset voltage in the presence of a the zero magnetic field.

Similarly, where resistors 1 and 4 do not match (e.g., by one ohm), it will be understood that the larger resistances 1 and 4 result in the mismatch of resistors 1 and 4 being a smaller percentage of the resistances of resistors 1 and 4, and therefore, also tend to make the mismatch of resistors 1 and 4 have a smaller impact on the differential signal 814a, 814b, i.e., resulting in a smaller offset voltage in the presence of a the zero magnetic field. Thus, increasing the resistances associated with resistors 1 and 4 through skipped contacts, for example, results in corresponding branches (i.e., a branch comprising resistors 1 and 2, a branch comprising resistors 3 and 4) of equivalent circuit 812 looking more alike.

It is to be appreciated that equivalent circuit 812 of FIG. 8A is provided as a non-limiting example and other equivalent circuits can be used to represent the vertical Hall element 802 of FIG. 8.

Figure 9:
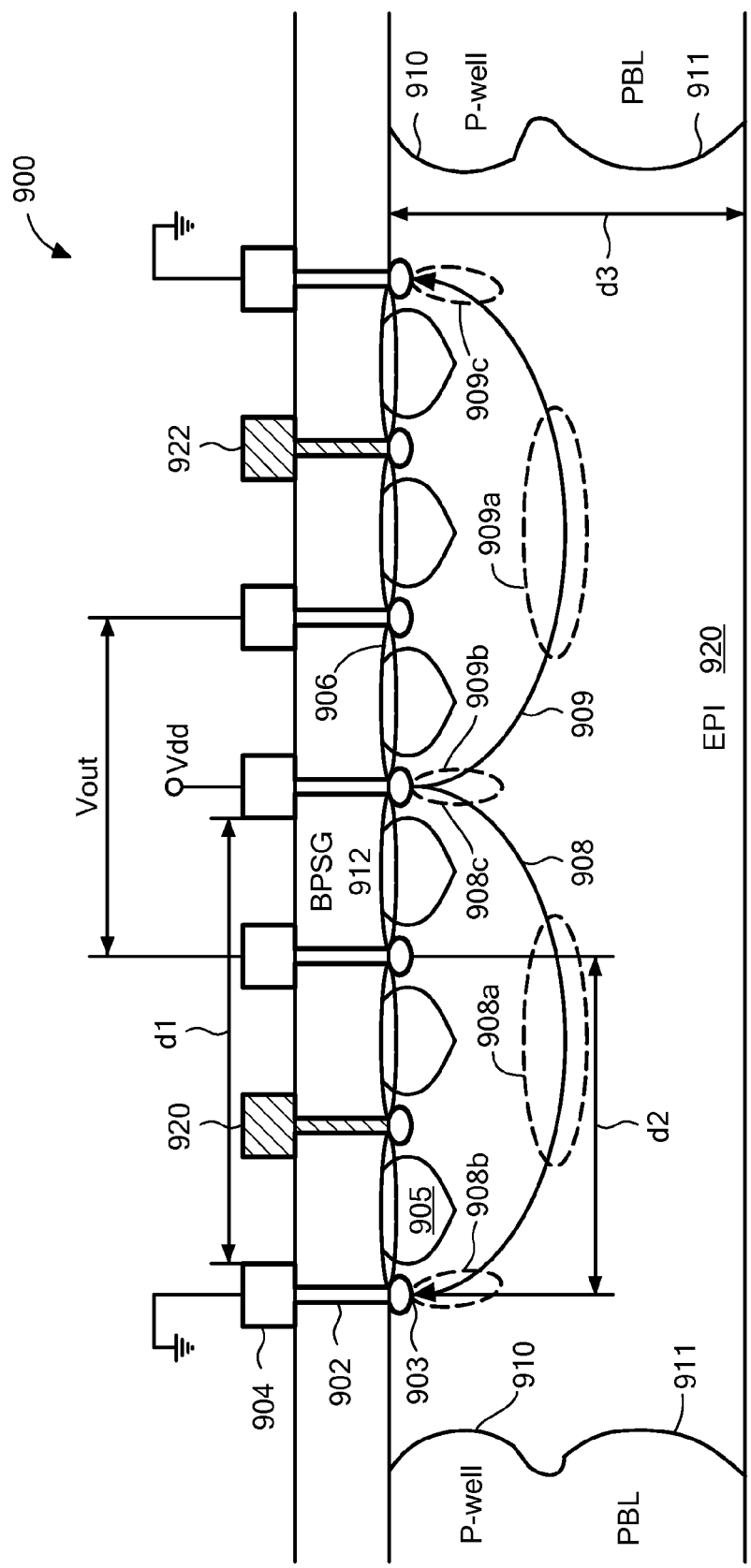
FIG. 9 is a cross section of an exemplary vertical Hall element, which has vertical resistance and a horizontal resistance associated with the vertical Hall element.

Referring now to FIG. 9, shown is a vertical Hall Effect element 900, which can, for example, be the same as or similar to any one of the vertical Hall Effect elements 702, 702', 712, and 802 of FIGS. 7, 7A, and 8, respectively.

It is to be appreciated that the vertical Hall element 900 is representative of the vertical Hall element at an intermediate step of integrated circuit fabrication. In particular, the vertical Hall element 900 does not show additional layers and structures that may be formed over the vertical Hall element 900.

The vertical Hall Effect element 900 is constructed over a substrate 930, in particular, within and upon an epitaxial (epi) region 920 (also referred to herein as an epi layer) disposed upon a surface of the substrate 930. The epi layer 920 as briefly discussed above and further discussed below, has an associated resistance.

An outer horizontal boundary of the epi region 204 is determined by an inner edge (closest to the pickups) of a P-well region 910 that surrounds pickups (e.g. 903). The P-well region 910 is implanted and diffused into the epi region 920 from a surface of the epi region 920 furthest from the substrate 300.

The vertical Hall element 900 can further include a plurality of so-called "pickups," of which a pickup 903 is representative. As used herein, the term "pickup" is used to describe an N+ active region implanted and diffused into a semiconductor structure, i.e., into an outer surface of the epi region 920, and which is used to provide an area at which an electrical signal is received from the semiconductor structure or at which an electrical signal is input to the semiconductor structure. In particular, the pickup 903 is an active or device region first defined by a "device" photo resist mask, which is thereafter removed.

Placement of the device photo resist mask (not shown) and implantation of the pickups can be preceded by formation of the field oxide layer 906 over an upper surface of the epi region 920. Openings can be provided (i.e., etched) through the field oxide layer 906 by way of the device photo resist mask, the openings for implantation of the pickups, e.g., 903. Openings through the field oxide layer 906 may ALSO be provided over the P-well region 910 for a masked P+ implant to result, upon diffusion, in the P-well region 910.

An LP region 905 can be implanted and diffused into the outer surface of the epi region 920. Further diffusion results in the LP region becoming closer to the pickup 903. The LP region can be comprised of one contiguous LP region with different parts. In other embodiments, the LP region can be comprised of separate non-contiguous parts. Additionally, the LP region extends into so-called "separation regions" between the pickups.

A vertical Hall element having an LP region, the LP region alone resulting in an improved sensitivity, is described in U.S. patent application Ser. No. 13/752,682, filed Jan. 29, 2013, and entitled "A Vertical Hall Effect Element with Improved Sensitivity," which is assigned to the assignee of the present disclosure, and which is incorporated by reference herein in its entirety.

A borophosphosilicate glass (BPSG) layer, i.e., a doped oxide, 912 can be deposited over the top of the field oxide and its opening regions 902. This BPSG layer 912 in the vertical Hall element 900 provides a separation and isolation between the layers shown and additional layers not shown.

The BPSG layer 912 can be masked (e.g., with a contact mask) and etched to form openings through the BPSG layer 912, in which so-called "contacts," described below, can be formed. As described above, openings through the field oxide layer are created and defined with a "device" mask or an "active" mask over the pickups, e.g., the pickup 903, and it is through those openings that the pickups 903 are originally formed with N+ implant and diffusion steps prior to the BPSG deposition. Similarly, the masked P+ implant and diffusion can be formed in the outer isolation region over the field oxide opening there.

Associated with each one of the pickups, for example, with the pickup 903, is a so-called "contact," of which a contact 904 is representative. Two skipped contacts, 920, 922 are shown which can be the same as or similar to skipped contracts shown above in conjunction with FIG. 7. Thus, the contacts include both active vertical Hall contacts and skipped contacts, as described above. As used herein, the term "contact" is used to describe a metalized connection of a semiconductor structure, for example, metal plating over contact openings through the BPSG layer 912. The contact, e.g., 904, which extends into the opening 902 forming a via, provides a low resistance electrical coupling to a pickup, e.g., to the pickup 903.

Associated with and electrically coupled to each one of the contacts, for example, with the contact 904 (or with a plurality of contacts coupled to the pickup 903), is a metal structure, or simply a "metal". As used herein, the term "metal" is used to describe a portion of a metal layer of a semiconductor structure used to provide a low resistance electrical coupling to a contact, e.g., to the contact 904.

As discussed above with respect to FIGS. 7B-7E, according to some embodiments, a largest distance between active vertical Hall contacts (denoted by d1, for example) is less than a depth of the epi layer 920 (denoted by d3, for example).

A PBL structure 913 (also referred to herein as a P-type barrier layer region) is implanted over the substrate 930 before placement of the epi region 920. The PBL structure joins with or merges with the P-well region forming a barrier to electrical charges that move within the epi layer 920 during operation of the vertical Hall element 900.

Adjacent pairs of the plurality of pickups are separated by so-called separation regions, e.g., a region in which the LP region 905 is disposed. Each one of the plurality of pickups, e.g., pickup 903, is comprised of an N+ implant and diffusion. Other layers can also be disposed over the epi region 920, which can contribute to the horizontal resistance observed. In some embodiments the other layers include one or more interlayer dielectric (ILD) layers, one or more metal layers, e.g., M2 or and M3 layers, and a passivation layer, none of which are shown.

Currents 908, 909 are produced when select contacts of the vertical Hall element 900 are coupled to one or more current sources, like the current sources shown in the chopping phases of FIGS. 4-4C, which can be generated by a drive circuit, like drive circuit 305 of FIG. 3.

The currents 908, 909 can have parts 908a, 909a that are substantially horizontal and parts 908b, 908c and 909b, 909c that are substantially vertical. When passing through the epi layer 920, the horizontal current parts 908a, 908b experience the above-described horizontal resistances, of which resistances 1, 2, 3, and 4 of FIG. 8 are representative. When passing through the epi layer 920, the vertical current parts 908b, 908c and 909b, 909c experience the above-described vertical resistances, or which resistances $Rb_v$, $Rd_v$, $Re_v$, $Rf_v$, and $Rh_v$ of FIG. 8 are representative. It will be appreciated that presence of the skipped contacts 920. 9212 makes the horizontal current parts 909a, 908b longer (and therefore, higher resistance) than they otherwise would be. However, the vertical resistances associated with vertical currents 908b, 908c and 909b, 909c are not affected by the skipped contacts 920, 922, Sensitivity of the vertical Hall element 900 can be related to vertical portions of the currents 908, 909, i.e., portions of the current paths that are perpendicular to the substrate 930. The LP regions, for example, provide a blockage of portions of the currents 908, 909 that might otherwise flow horizontally directly between the center pickup and the end pickups. Thus, the LP regions cause the currents 908, 909 to have more extended vertical regions than would otherwise be available, resulting in a higher sensitivity vertical Hall element 900.

Reduction of offset voltages of the vertical Hall element 900 is achieved by the higher resistance of the horizontal currents 908a, 909a, for reasons discussed above in conjunction with FIG. 8.

While the vertical Hall element 900 is shown to include active five contacts, in other similar embodiments, a vertical Hall element can include any number of active contacts, i.e., more than or fewer than five active contacts and also can include any number of skipped contacts.

In some embodiments, the vertical Hall element 900 can be "chopped," like the chopping arrangements shown in FIGS. 4-4C. In the contexts of pickups 903, it will be understood that chopping is an arrangement by which, at some times, one or more selected contacts of the vertical Hall element 900 are driven and at other times a different selected one or more contacts are driven. Similarly, at some times, a differential output signal is generated between a particular pair of the contacts, and at other times an output signal is generated between a different pair of the contacts.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
  a circular vertical Hall (CVH) sensing element comprising:
    a plurality of vertical Hall elements arranged over a common implant and diffusion region in a substrate, wherein the plurality of vertical Hall elements is configured to generate a plurality of magnetic field signals, each magnetic field signal responsive to a magnetic field; the magnetic field sensor further comprising:
  a sequence switches circuit coupled to the plurality of vertical Hall elements, wherein the sequence switches circuit is operable to select from among the plurality of vertical Hall elements, and wherein the sequence switches circuit is configured to supply a current signal or a voltage signal to the plurality of vertical Hall elements, wherein each selected one of the plurality of vertical Hall elements comprises a respective plurality of active vertical Hall element contacts and at least one respective skipped contact, the at least one skipped contact disposed between at least one respective pair of the respective plurality of active vertical Hall element contacts, wherein a position of the at least one skipped contact is selected to reduce an offset voltage of a respective one of the plurality of vertical Hall elements,
  wherein the respective at least one skipped contact for each selected one of the plurality of vertical Hall elements is not coupled to receive the current signal or the voltage signal, is not configured to couple to a reference potential, and an output signal of the sequence switches circuit is not configured to be generated by the respective at least one skipped contact.

2. The magnetic field sensor of claim 1, further comprising:
  a control circuit configured to provide a control signal to the sequence switches circuit for sequential selection from among the plurality of vertical Hall elements.

3. The magnetic field sensor of claim 1, wherein the at least one skipped contact comprises two skipped contact.

4. The magnetic field sensor of claim 1, wherein the at least one skipped contact comprises a pair of skipped contacts symmetrically surrounding a center active vertical Hall element contact of each selected one of the plurality of vertical Hall elements.

5. The magnetic field sensor of claim 1, wherein the at least one skipped contact comprises a pair of skipped contacts, each skipped contact proximate to a last active vertical Hall element contact of each selected one of the plurality of vertical Hall elements.

6. The magnetic field sensor of claim 1, wherein the plurality of vertical Hall elements overlap and share select vertical Hall element contacts with an adjacent selected one of the plurality of vertical Hall elements.

7. The magnetic field sensor of claim 1, wherein at least one of the vertical Hall element contacts of the plurality of vertical Hall elements is selected from a non-adjacent selected one of the plurality of vertical Hall elements.

8. The magnetic field sensor of claim 1, wherein a position of the at least one skipped vertical Hall element contact is selected based upon a conformal mapping of a respective selected one of the plurality of vertical Hall elements.

9. The magnetic field sensor of claim 8, wherein a distance between the active vertical Hall element contacts of each selected one of the plurality of vertical Hall elements is unequal and wherein a resistance between the active vertical Hall element contacts of each selected one of the selected plurality of vertical Hall elements is unequal.

10. The magnetic field sensor of claim 1, wherein each one of the active vertical Hall element contacts of each selected one of the plurality of vertical Hall elements is associated with a respective vertical resistance and a respective horizontal resistance, and wherein a position of the at least one skipped contact results in an increase in the horizontal resistance.

11. The magnetic field sensor of claim 4, wherein each one of the active vertical Hall element contacts of each selected one of the plurality of vertical Hall elements is associated with a respective vertical resistance and a respective horizontal resistance, and wherein a position of the pair of skipped contacts results in an increase in the horizontal resistance.

12. The magnetic field sensor of claim 1, wherein the at least one skipped contact comprises four skipped contacts.

13. A method, comprising:
  generating a plurality of magnetic field signals with a circular vertical Hall (CVH) sensing element, the CVH sensing element comprising a plurality of vertical Hall elements arranged over a common implant and diffusion region in a substrate, each magnetic field signal being responsive to a magnetic field;
  selecting from among the plurality of vertical Hall elements with a sequence switches circuit, wherein the sequence switches circuit is configured to supply a current signal or a voltage signal to the plurality of vertical Hall elements, wherein each selected one of the plurality of vertical Hall elements comprises a respective plurality of active vertical Hall element contacts and at least one respective skipped contact, the at least one skipped contact disposed between at least one respective pair of the respective plurality of active vertical Hall element contacts, wherein a position of the at least one skipped contact is selected to reduce an offset voltage of a respective one of the plurality of vertical Hall elements,
  wherein the respective at least one skipped contact for each selected one of the plurality of vertical Hall elements is not coupled to receive the current signal or the voltage signal, is not configured to couple to a reference potential, and an output signal of the sequence switches circuit is not configured to be generated by the respective at least one skipped contact.

14. The method of claim 13, further comprising:
  sequentially selecting from among the plurality of vertical Hall elements.

15. The method of claim 13, wherein the at least one skipped contact comprises two skipped contacts.

16. The method of claim 13, wherein the at least one skipped contact comprises a pair of skipped contacts symmetrically surrounding a center active vertical Hall element contact of each selected one of the plurality of vertical Hall elements.

17. The method of claim 13, wherein the at least one skipped contact comprises a pair of skipped contacts, each skipped contact of the pair proximate to a last active vertical Hall element contact of each selected one of the plurality of vertical Hall elements.

18. The method of claim 13, wherein the plurality of vertical Hall elements overlap and share select vertical Hall element contacts with an adjacent selected one of the plurality of vertical Hall elements.

19. The method of claim 13, wherein at least one of the vertical Hall element contacts of the plurality of vertical Hall elements is selected from a non-adjacent selected one of the plurality of vertical Hall elements.

20. The method of claim 13, wherein a position of the at least one skipped vertical Hall element contact is selected based upon a conformal mapping of a respective selected one of the plurality of vertical Hall elements.

21. The method of claim 20, wherein a distance between the active vertical Hall element contacts of each selected one of the plurality of vertical Hall elements is unequal and wherein a resistance between the active vertical Hall element contacts of each selected one of the plurality of vertical Hall elements is unequal.

22. The method of claim 13, wherein each one of the active vertical Hall element contacts of the selected plurality of vertical Hall elements is associated with a respective vertical resistance and a respective horizontal resistance, and wherein a position of the at least one skipped contact results in an increase in the horizontal resistance.

23. The method of claim 17, wherein each one of the active vertical Hall element contacts of each selected one of the plurality of vertical Hall elements is associated with a respective vertical resistance and a respective horizontal resistance, and wherein a position of the pair of skipped contacts results in an increase in the horizontal resistance.

24. The method of claim 13, wherein the at least one skipped contact comprises four skipped contacts.

* * * * *

UNITED STATES PATENT AND TRADEMARK OFFICE
CERTIFICATE OF CORRECTION

PATENT NO. : 9,753,097 B2
APPLICATION NO. : 14/269973
DATED : September 5, 2017
INVENTOR(S) : Hernan D. Romero It is certified that error appears in the above-identified patent and that said Letters Patent is hereby corrected as shown below:

Abstract (57), Line 11, delete "sequences switches" and replace with --sequence switches--.

Column 1, Line 28, delete "and angle" and replace with --an angle--.

Column 1, Line 44, delete "PCT/EP2008056517" and replace with --PCT/EP2008/056517--.

Column 3, Line 11, delete "is pictorial" and replace with --is a pictorial--.

Column 6, Lines 14-15, delete "(CVH) element 112" and replace with --(CVH) sensing element 112--.

Column 6, Line 41, delete "element 12$a$" and replace with --element 0--.

Column 6, Lines 42-43, delete "vertical Hall element 118" and replace with --vertical Hall element 8--.

Column 7, Line 3, delete "substrate 134," and replace with --substrate,--.

Column 7, Line 51, delete "sine wave 254" and replace with --sine wave 204--.

Column 7, Line 55, delete "signal 252" and replace with --signal 202--.

Column 8, Line 44, delete "magnet 344" and replace with --magnet 314--.

Column 8, Line 45, delete "object 346, which magnet 344" and replace with --object 316, which magnet 314--.

Column 9, Line 66, delete "x-y angle signal 330" and replace with --x-y angle signal 330$a$--.

Signed and Sealed this
Eighth Day of January, 2019

Andrei Iancu
*Director of the United States Patent and Trademark Office*

Column 11, Line 36, delete "chopped one of the time" and replace with --chopped one at a time--.

Column 11, Line 60, delete "vertical a Hall" and replace with --vertical Hall--.

Column 12, Line 20, delete "vertical Hal" and replace with --vertical Hall--.

Column 12, Line 48, delete "contact 402c" and replace with --contact 402e--.

Column 13, Lines 53-54, delete "magnetic field sensor 100" and replace with --magnetic field sensor 300--.

Column 14, Line 14, delete "relative the signal" and replace with --relative to the signal--.

Column 14, Line 49, delete "variety factors" and replace with --variety of factors--.

Column 14, Lines 52-53, delete "experience" and replace with --experienced--.

Column 17, Line 40, delete "select contacts" and replace with --selected contacts--.

Column 17, Line 49, delete "CVH element" and replace with --CVH sensing element--.

Column 17, Line 51, delete "CVH element" and replace with --CVH sensing element--.

Column 18, Line 33, delete "contacts as are possible" and replace with --contacts are possible--.

Column 18, Line 55, delete "skipped contracts" and replace with --skipped contacts--.

Column 19, Line 26, delete "contacts b, d, e, f h," and replace with --contacts b, d, e, f, h,--.

Column 19, Line 34, delete "coupled to t active" and replace with --coupled to active--.

Column 19, Line 35, delete "d, e, f h," and replace with --d, e, f, h,--.

Column 20, Line 4, delete "a the zero" and replace with --a zero--.

Column 20, Lines 12-13, delete "of a the zero" and replace with --of a zero--.

Column 20, Line 39, delete "epi region 204" and replace with --epi region 920--.

Column 20, Line 63, delete "ALSO" and replace with --also--.

Column 21, Line 34, delete "skipped contracts" and replace with --skipped contacts--.

Column 21, Line 55, delete "structure 913" and replace with --structure 911--.

Column 22, Line 19, delete "920. 9212" and replace with --920, 922--.

Column 22, Line 20, delete "909*a*, 908*b*" and replace with --908*a*, 909*a*--.

Column 23, Line 49, delete "contact" and replace with --contacts--.